United States Patent
Pathak et al.

(10) Patent No.: US 12,379,767 B2
(45) Date of Patent: Aug. 5, 2025

(54) ON-CHIP VOLTAGE ASSIGNMENT THROUGH PARTICLE SWARM OPTIMIZATION

(71) Applicant: Drexel University, Philadelphia, PA (US)

(72) Inventors: Divya Pathak, Karnataka (IN); Ioannis Savidis, Wallingford, PA (US)

(73) Assignee: Drexel University, Philadelphia, PA (US)

( * ) Notice: Subject to any disclaimer, the term of this patent is extended or adjusted under 35 U.S.C. 154(b) by 1083 days.

(21) Appl. No.: 17/271,121

(22) PCT Filed: Sep. 3, 2019

(86) PCT No.: PCT/US2019/049353
§ 371 (c)(1),
(2) Date: Feb. 24, 2021

(87) PCT Pub. No.: WO2020/051145
PCT Pub. Date: Mar. 12, 2020

(65) Prior Publication Data
US 2021/0247839 A1    Aug. 12, 2021

Related U.S. Application Data

(60) Provisional application No. 62/726,345, filed on Sep. 3, 2018.

(51) Int. Cl.
*G06F 30/30* (2020.01)
*G06F 1/3234* (2019.01)
(Continued)

(52) U.S. Cl.
CPC ............ *G06F 1/3296* (2013.01); *G06F 1/324* (2013.01); *G06F 1/3243* (2013.01); *G06F 30/25* (2020.01);
(Continued)

(58) Field of Classification Search
CPC ...... G06F 1/3296; G06F 1/324; G06F 1/3243; G06F 30/25; G06F 30/337; G06F 30/392;
(Continued)

(56) References Cited

U.S. PATENT DOCUMENTS

| 7,200,824 B1 | 4/2007 | Sidhu et al. |
| 7,915,910 B2 | 3/2011 | Von Kaenel |

(Continued)

OTHER PUBLICATIONS

Amrouch et al., "Reliability-Aware Design to Suppress Aging", 2016 ACM. ISBN 978-1-4503-4236-0/16/06 (Year: 2016).*

(Continued)

*Primary Examiner* — Jack Chiang
*Assistant Examiner* — Brandon Bowers
(74) *Attorney, Agent, or Firm* — Schott, P.C.

(57) ABSTRACT

An on-chip voltage delivery method for a system includes multiple processor cores operating at multiple voltage levels. Distributed on-chip DC-DC converters as voltage regulators may deliver point of load current to the different units of a processor core operating at the same voltage level. Distributed timing sensors calibrated to generate digitized clock edge location. A power management unit may take input from the timing sensors, processes it through a particle swarm optimizer and generates digitized voltage identification code as reference to the distributed voltage regulators. The particle swarm optimizer may provide disparate voltage levels feasible for a given frequency of operation of the processor core with a provision to operate at multiple frequencies. The run-time assignment of the voltage through the particle swarm optimizer may negate the effects of transistor aging, process, temperature, and power supply noise induced variation in the load circuits, voltage regulators and sensors.

14 Claims, 18 Drawing Sheets

(51) Int. Cl.
- *G06F 1/324* (2019.01)
- *G06F 1/3296* (2019.01)
- *G06F 30/25* (2020.01)
- *G06F 30/337* (2020.01)
- *G06F 30/392* (2020.01)
- *G06N 3/006* (2023.01)
- *G05F 1/575* (2006.01)
- *H02M 3/00* (2006.01)

(52) U.S. Cl.
CPC .......... *G06F 30/337* (2020.01); *G06F 30/392* (2020.01); *G06N 3/006* (2013.01); *G05F 1/575* (2013.01); *H02M 3/00* (2013.01)

(58) Field of Classification Search
CPC ........ G06N 3/006; G06N 3/126; G05F 1/575; H02M 3/00; Y02D 10/00
See application file for complete search history.

(56) References Cited

U.S. PATENT DOCUMENTS

| | | | |
|---|---|---|---|
| 8,823,447 B2 | 9/2014 | Gelman | |
| 8,850,380 B2 | 9/2014 | Bickford et al. | |
| 9,645,558 B2 | 5/2017 | Shokooh et al. | |
| 2011/0173432 A1* | 7/2011 | Cher | G01R 31/31725 702/186 |
| 2011/0267096 A1* | 11/2011 | Chlipala | G01R 31/31858 326/16 |
| 2014/0096100 A1* | 4/2014 | Sinha | G06F 30/367 716/113 |

OTHER PUBLICATIONS

Chithira et al., "Potential Critical Path Selection Based on a Time-Varying Statistical Timing Analysis Framework", IEEE Transactions on Very Large Scale Integration (VLSI) Systems, vol. 27, No. 6, June (Year: 2019).*

White et al., "Transistor Sizing Using Particle Swarm Optimisation" 2015 IEEE Symposium Series on Computational Intelligence (Year: 2015).*

International Preliminary Report on Patentability and Written Opinion issued from the International bureau of WIPO within the PCT Application No. PCT/US2019/049353, Dec. 30, 2019, 5 pages.

* cited by examiner

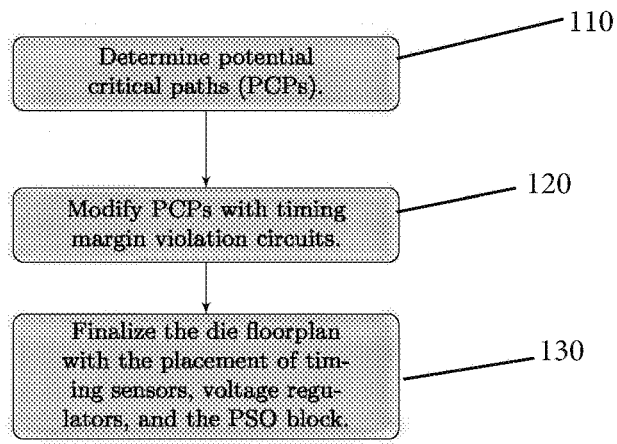
FIG. 1.1
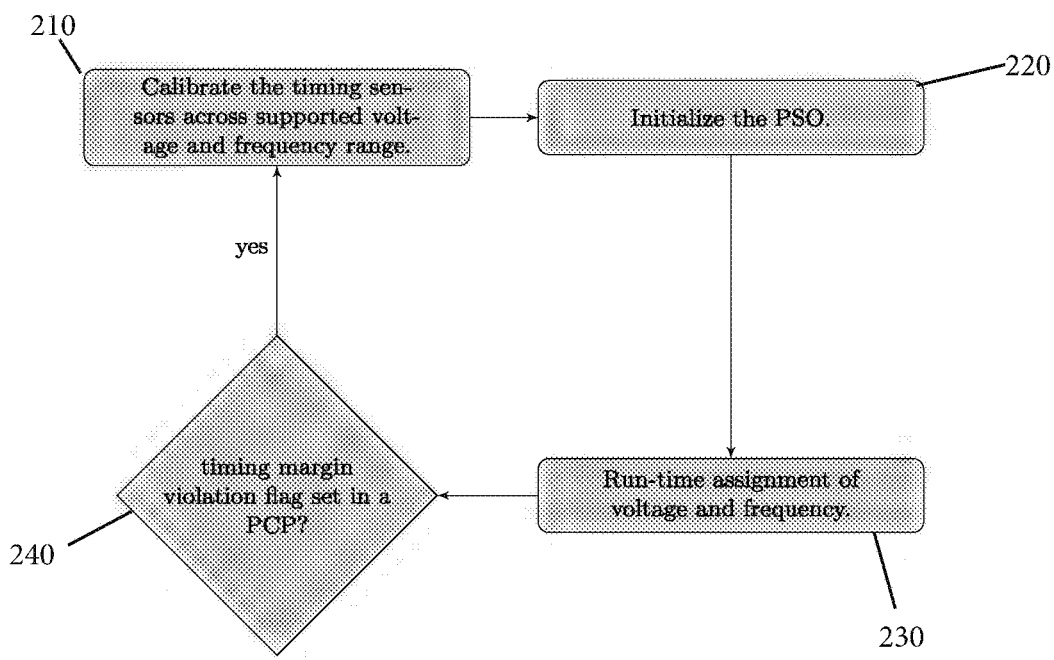
FIG. 1.2

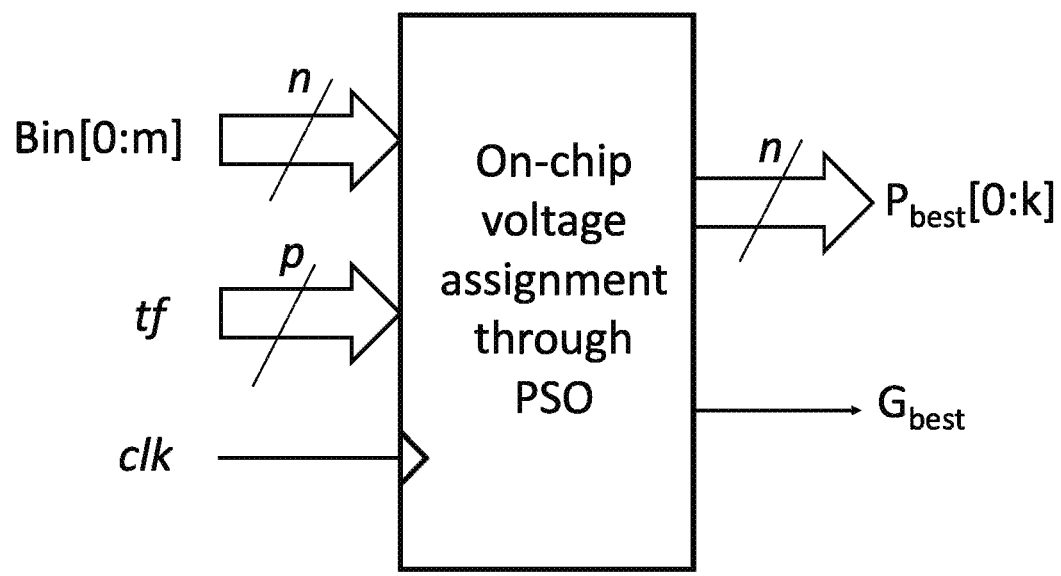
FIG. 1.3

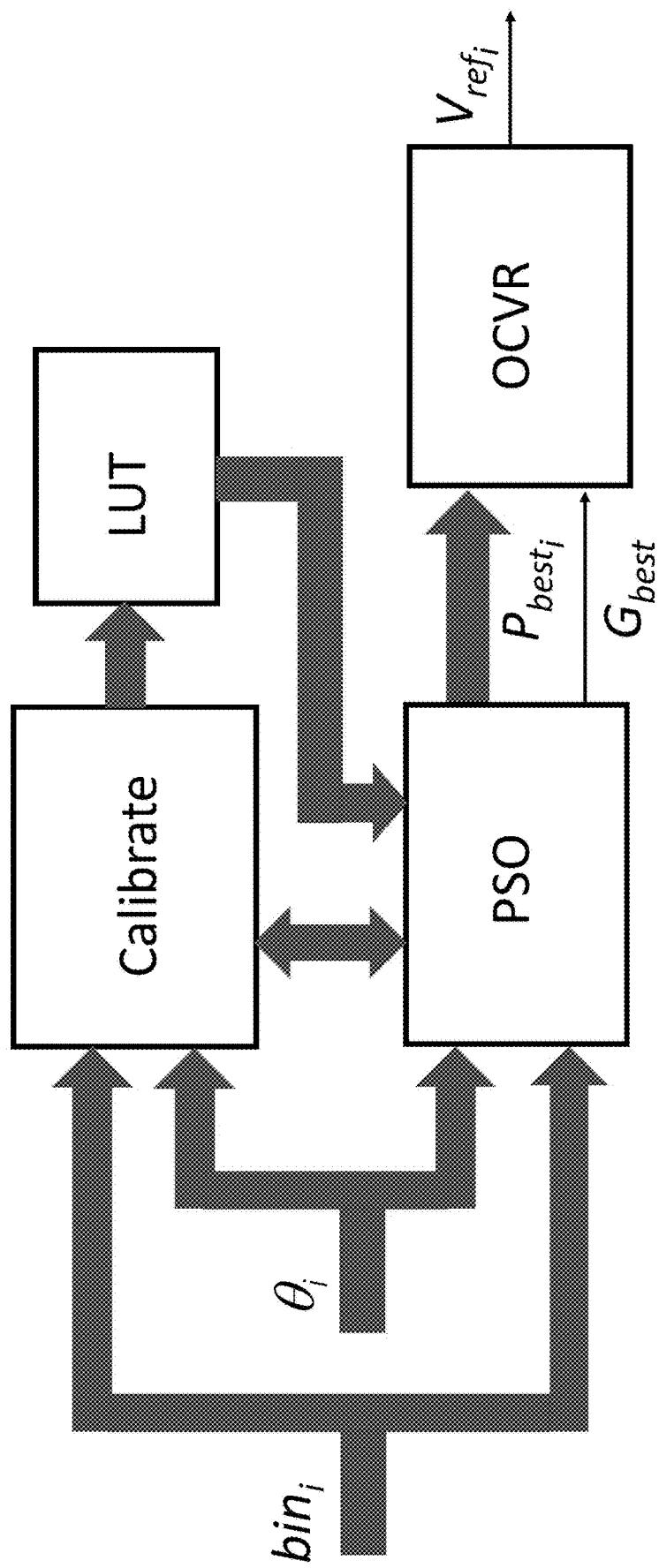
FIG. 1.4

Algorithm 1 Evolving power supply voltage assignment through particle swarm optimization.

Inputs:
Set of aging sensors in each potential critical path (PCP): $\Theta$
Timing sensors output: $bin(n \times m)$ for $n$ number of timing sensors, each with a precision of $m$ bits
System clock: $clk$
Outputs:
Local best voltage assignment: $P_{best}(n \times p)$ for $n$ number of distributed voltage regulators and $p$ bit VID code
Global best voltage assignment: $G_{best}$, $p$ bit VID code
▷ Timing sensor calibration at beginning of life and at timing margin violation
procedure CALIBRATE($bin$, $clk$, $P_{best}$)
    for each $bin_i$, $i \in [1:n]$ do
        for each $\nu_j$, $j \in [1:2^p]$ do ▷ for each VID code
            ▷ Compute the propagation delay per bin in the timing sensor
            $Delayperbin_j \leftarrow clk \times (bin_i[e_5] - bin_i[e_3])^{-1}$
            if calib_count == 0 then
                if $\nu_j == v_{nom}$ then
                    $calib_i \leftarrow bin_i[e_5]$
                    $x_i \leftarrow \nu_j$
                    calib_count ++
                end if
            else
                ▷ Search the LUT for the row with voltage equal to the $P_{best_i}$
                if $\nu_j == LUT_i(k, 1)(P_{best_i})$ then
                    $D_1 = LUT_i(k, calib\_count)(Delayperbin_k)$
                end if
                if $Delayperbin_j == D_1$ then
                    $calib_i \leftarrow bin_i[e_5]$ $x_i \leftarrow \nu_j$
                    calib_count ++
                end if
            end if
            ▷ Push the $Delayperbin$ computed per voltage in the LUT stack
            $LUT_i(j, calib\_count) \leftarrow Delayperbin_j$
        end for
        $P_{best_i} \leftarrow x_i$
        $v_i \leftarrow x_i$
    end for
    $G_{best} \leftarrow max(P_{best_i})$
    return $x$, $v$, $calib$, $P_{best}$, $G_{best}$
end procedure
procedure PSO($\Theta$, $bin$, $clk$, $x$, $v$)
    ▷ $V_{max}$, $V_{min}$ : Technology imposed voltage limit for the transistor.
    ▷ Particle velocity limits
    $v_{max} = \gamma*(V_{max} - V_{min})$;
    $v_{min} = -v_{max}$;
    ▷ $\gamma \in [0\ 1]$
    ▷ Constriction Coefficients:$\kappa \leftarrow 1$, $\phi_1 \in [0\ 10]$, $\phi_2 \in [0\ 10]$,
    ▷ $\phi \leftarrow \phi_1 + \phi_2$;
    ▷ $\chi \leftarrow \dfrac{2 \times \kappa}{|2 - \phi - \sqrt{\phi^2 - 4 \times \phi}|}$
    $\omega \leftarrow \chi$; ▷ Inertial Coefficient
    ▷ $w_{damp} \in [0\ 1]$; ▷ Damping ratio of inertia coefficient
    $c1 \leftarrow \chi \times \phi_1$; ▷ Personal Acceleration Coefficient
    $c2 \leftarrow \chi \times \phi_2$; ▷ Social Acceleration Coefficient
    At every $clk$ edge
    if $\theta_i \in \Theta == TRUE$ then ▷ timing violation on a PCP, recalibrate
        $(x, v, calib, P_{best}, G_{best}) \leftarrow$ calibrate($bin$)
    end if
    for each $x_i$, $i \in [1:N]$ do
        ▷ Compute particle velocity
        $v_i \leftarrow \omega * v_i + c1 \times rnd \times (P_{best\_i} - x_i) + c2 \times rnd \times (G_{best} - x_i)$;

▷ Apply velocity limits
        $v_i \leftarrow min(v_i, v_{max})$;
        $v_i \leftarrow max(v_i, v_{min})$;
        ▷ Update particle position
        $x_i \leftarrow x_i + v_i$;
        if $(bin_i[e_5] - calib_i > m'b0)$ && $(\theta_i \in \Theta == FALSE)$ then
            $P_{best_i} \leftarrow x_i$
        end if
        $\omega \leftarrow \omega \times w_{damp}$
    end for
    $G_{best} \leftarrow max(P_{best_i})$
    return $P_{best}$, $G_{best}$
end procedure

FIG. 1.5

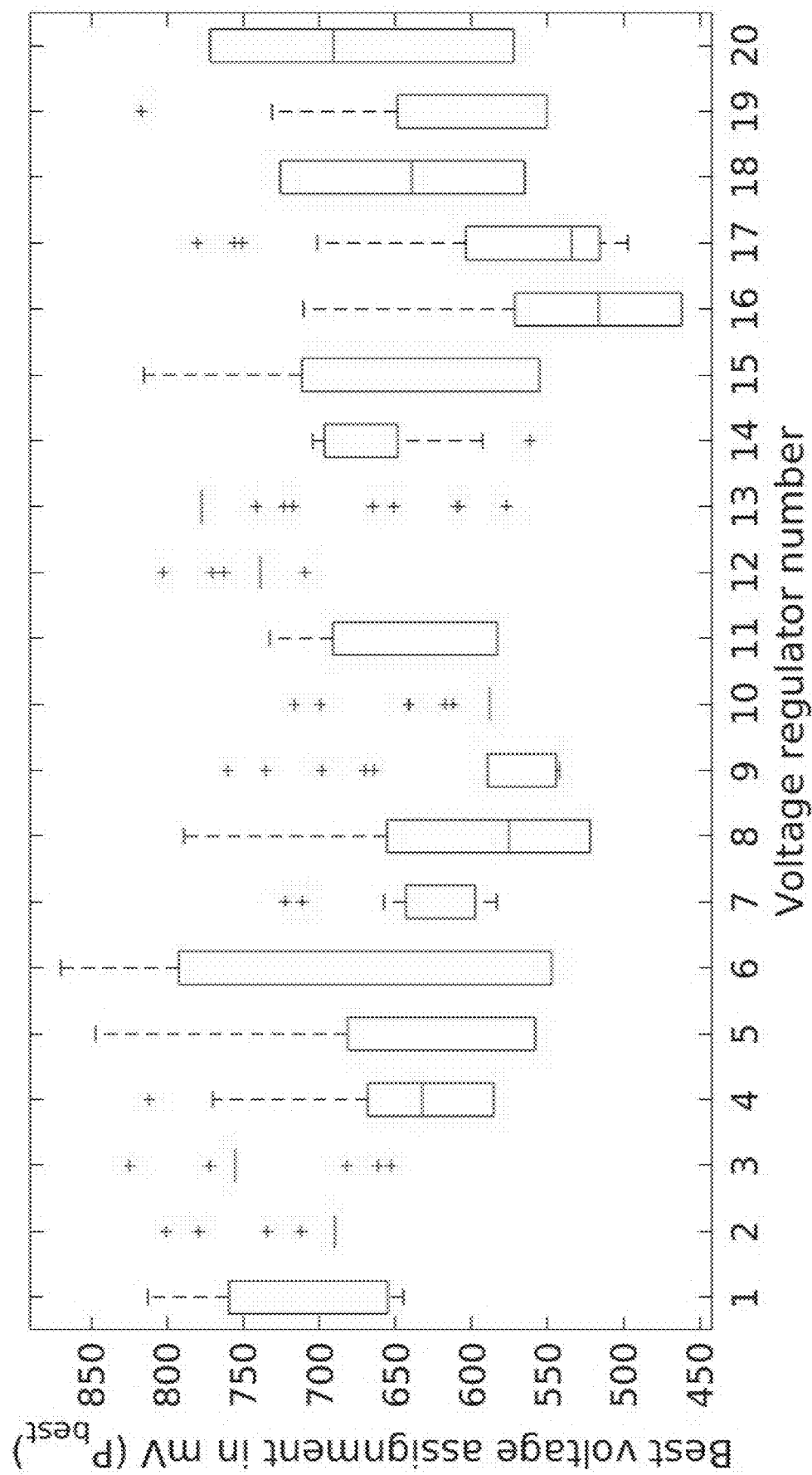
FIG. 1.6

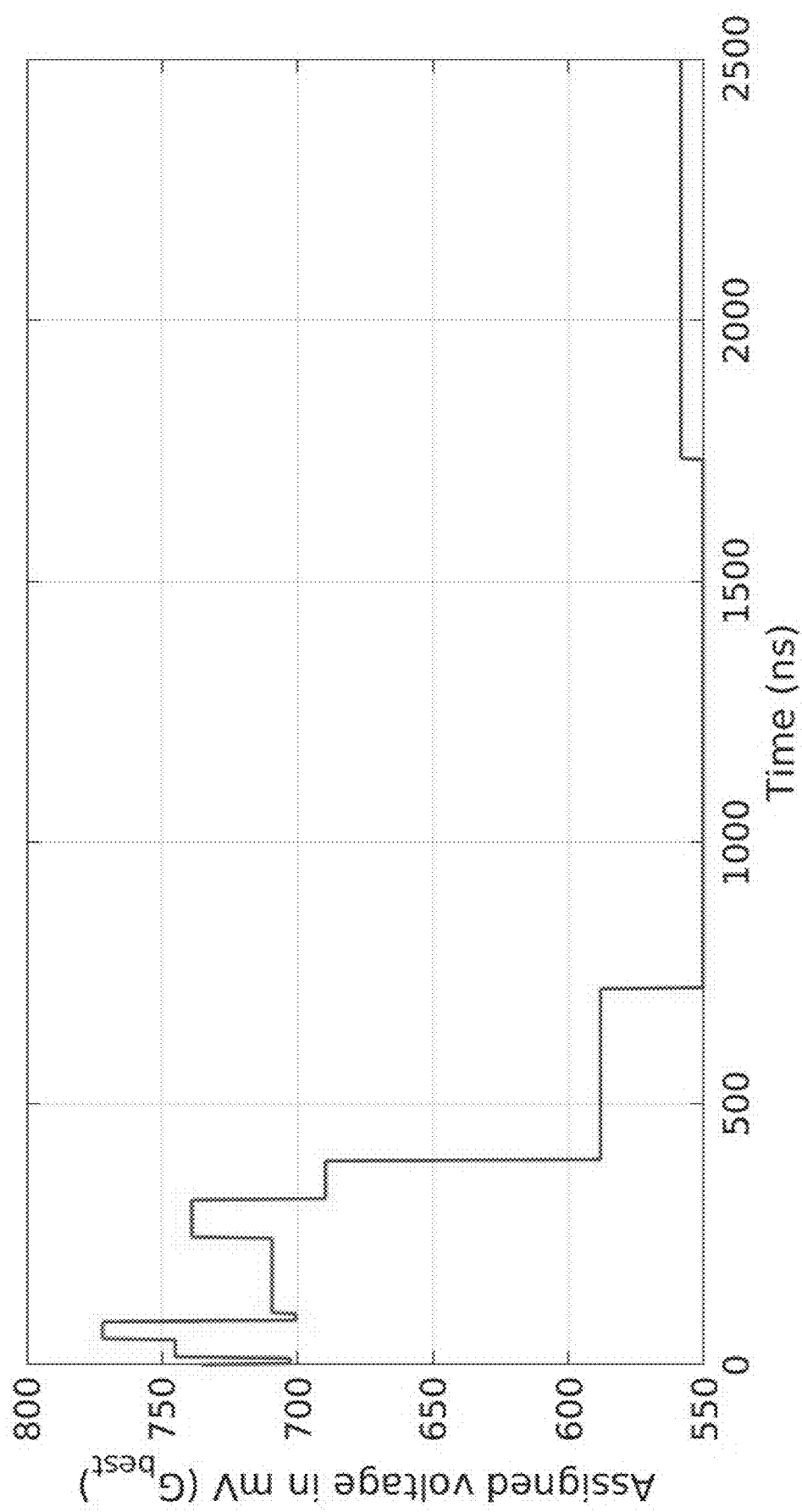
FIG. 1.7

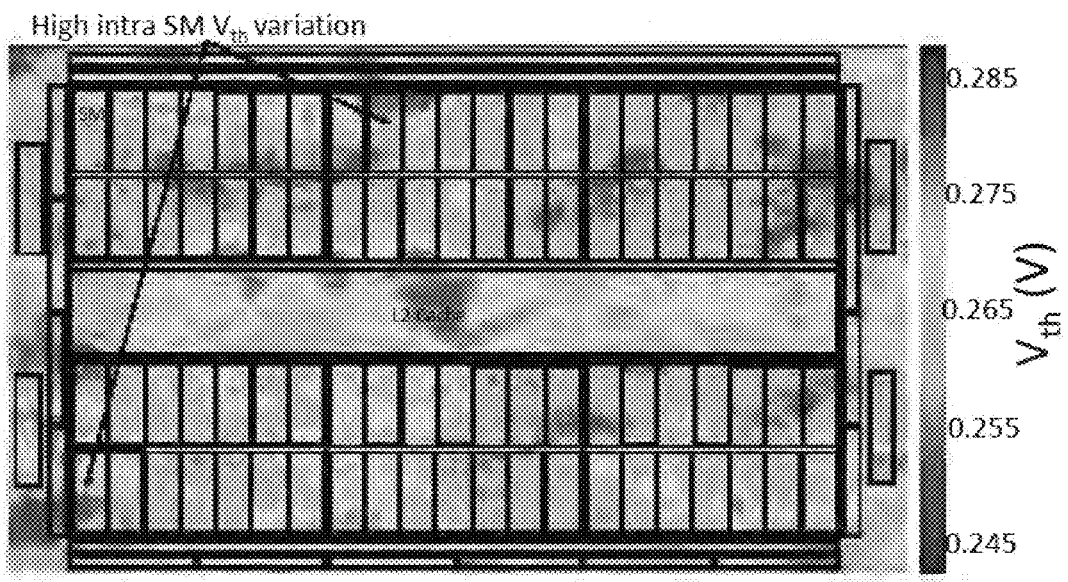
FIG. 2.1
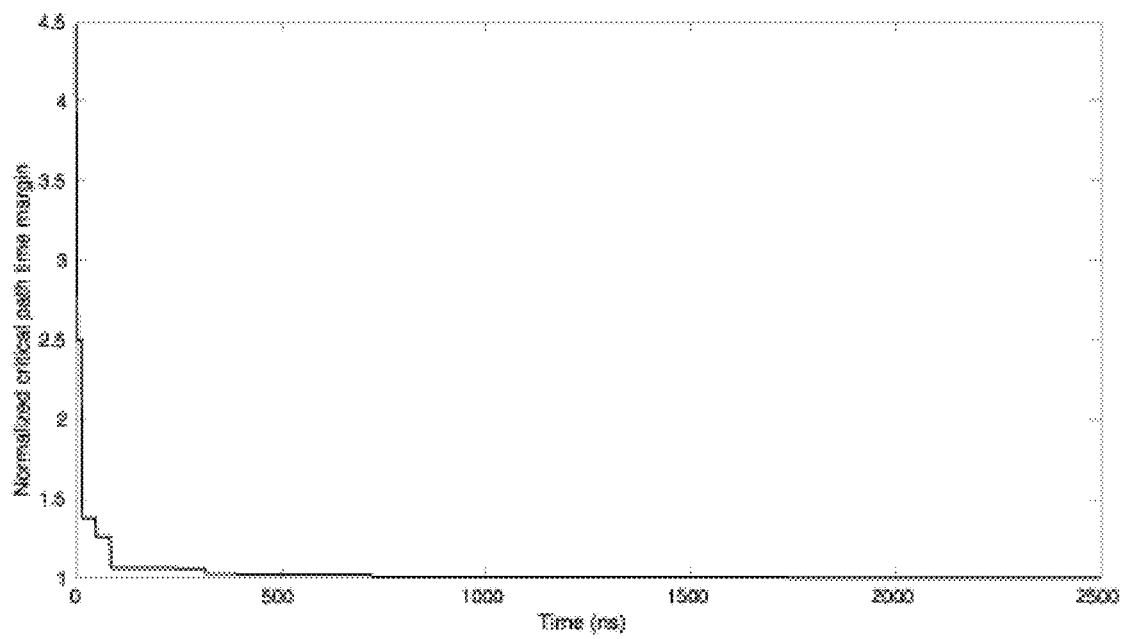
FIG. 1.8

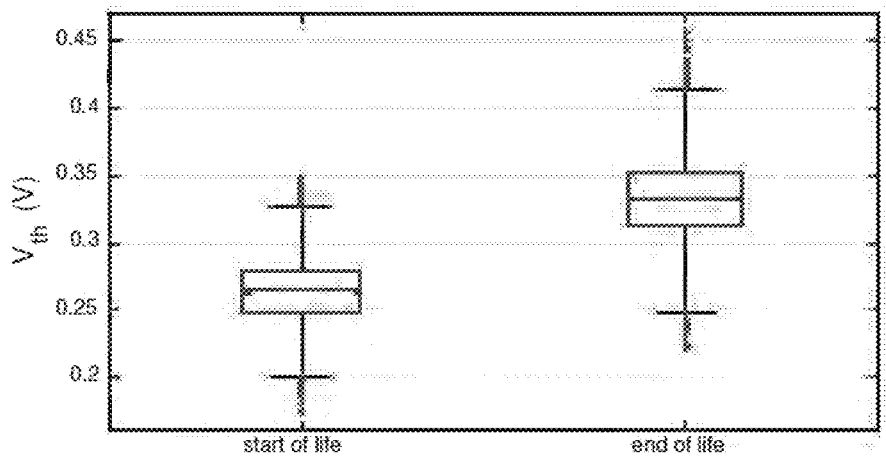
FIG. 2.2(a)
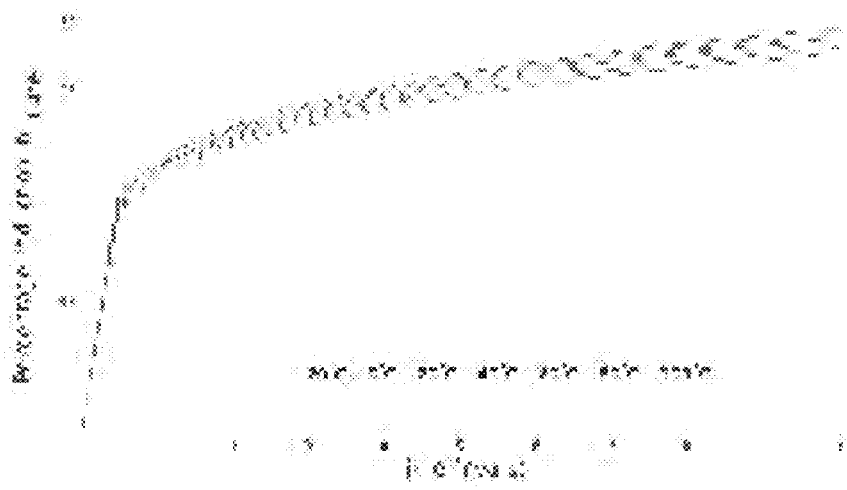
FIG. 2.2(b)

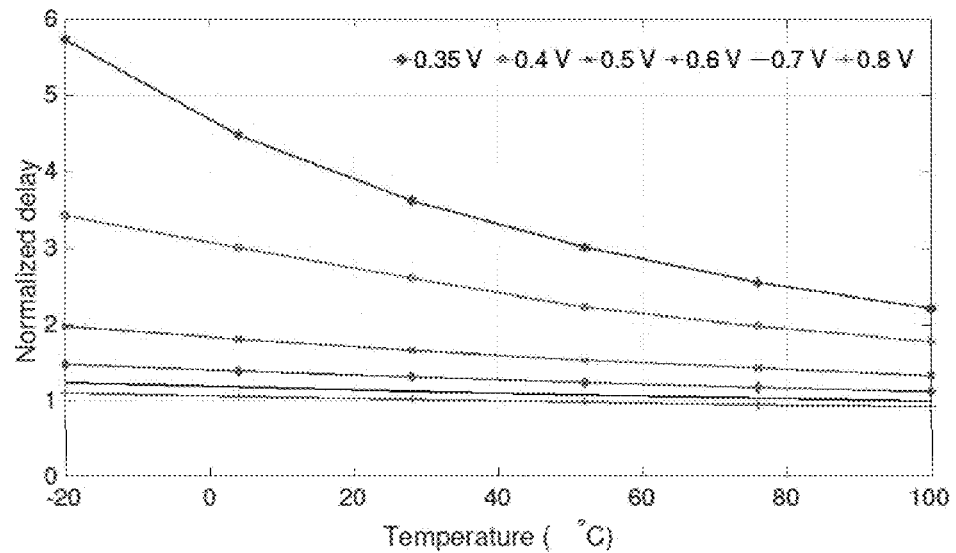
FIG. 2.3
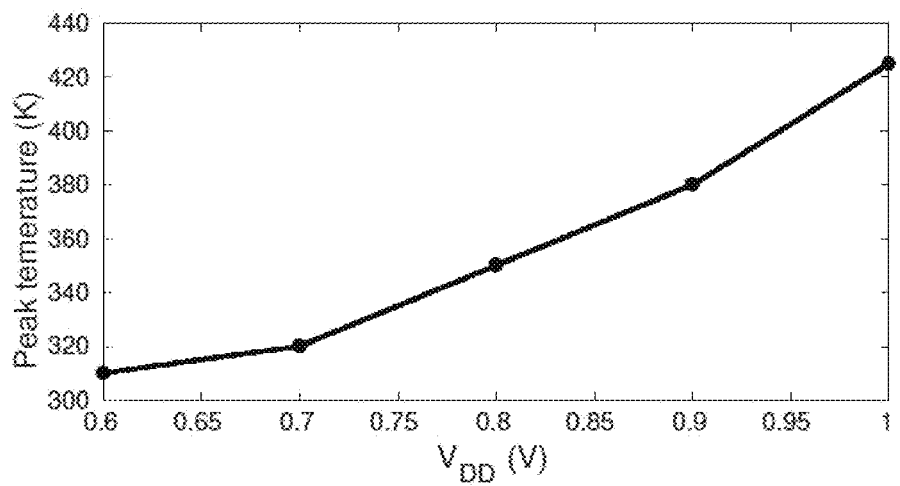
FIG. 2.4

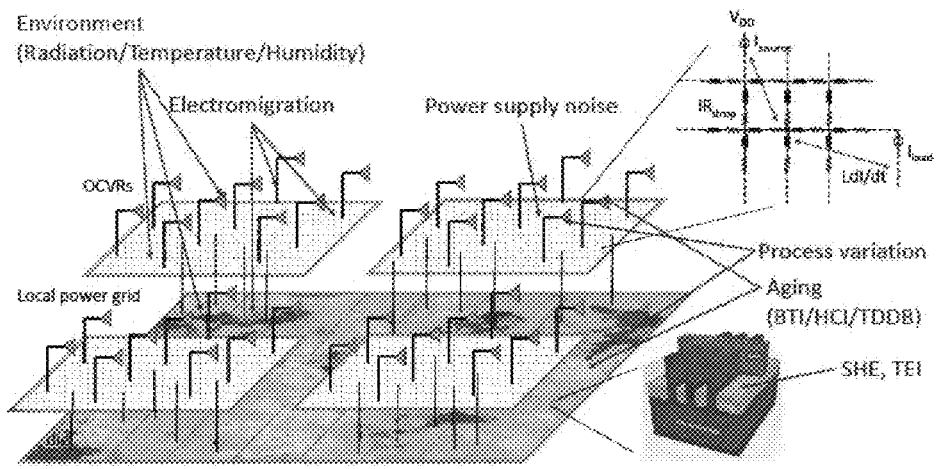
FIG. 2.5
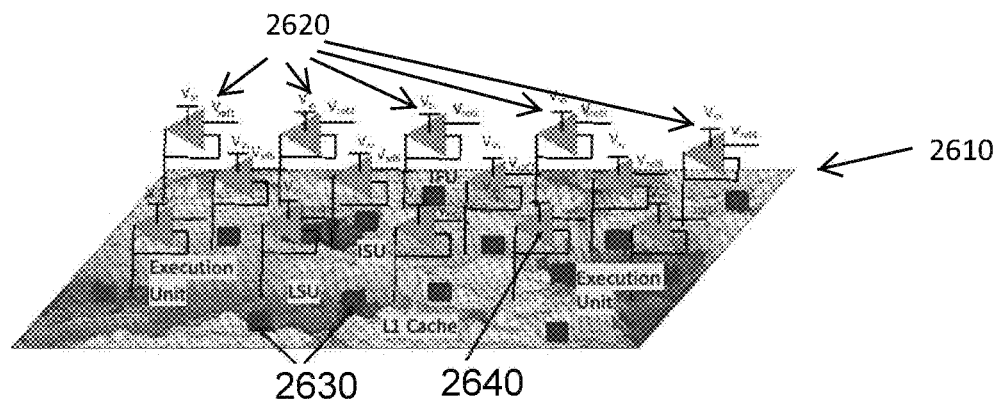
FIG. 2.6

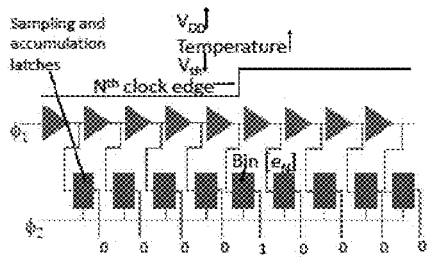 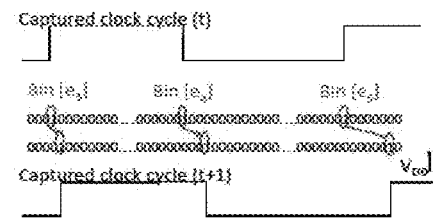
FIG. 2.8 (a)    FIG. 2.8 (b)
TABLE I: Results stored in a look up table ($LUT_i$) for the $i^{th}$ timing sensor.
| Voltage | $Delayperbin_1$ | $Delayperbin_2$ | ... | $Delayperbin_t$ |
|---|---|---|---|---|
| $V_{min}$ | ⋮ | ⋮ | ⋮ | ⋮ |
| $P_{best_1}$ | $D_1$ | $D_2$ | ⋮ | ⋮ |
| $P_{best_2}$ | ⋮ | $D_1$ | ⋮ | ⋮ |
| $v_{nom}$ | ⋮ | ⋮ | ⋮ | ⋮ |
| $V_{min}$ | ⋮ | ⋮ | ⋮ | ⋮ |
calib_count →
FIG. 2.10

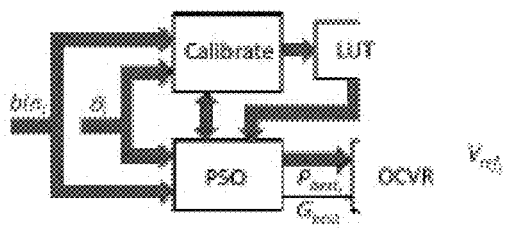
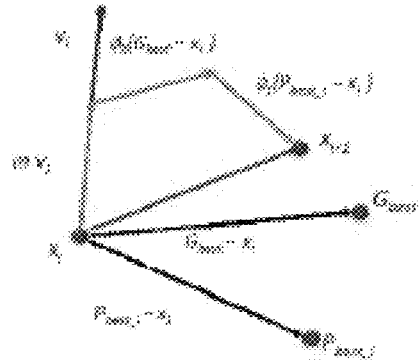
FIG. 2.7 (a)  FIG. 2.7 (b)
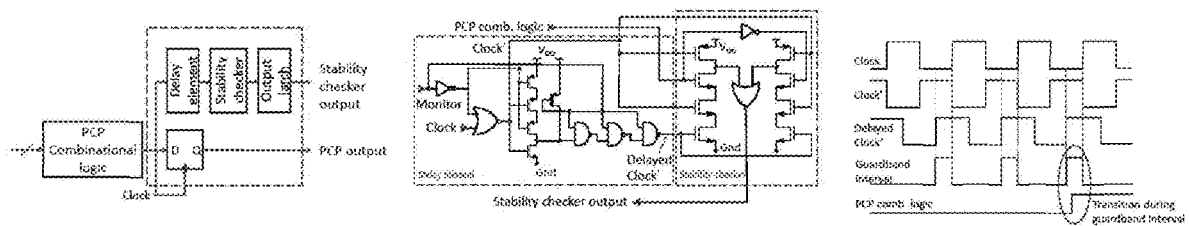
FIG. 2.9 (a)  FIG. 2.9 (b)  FIG. 2.9 (c)
TABLE II: Architectural parameters of the core in a 16 core CMP.
| Parameter | Value |
|---|---|
| Core clock frequency | 4 GHz |
| Power supply voltage ($V_{dd}$) | 0.7 V |
| Issue, commit width | 2 |
| INT and FP instruction queue | 16 entries |
| Load and Store Queue | 16 entries |
| INT and FP Register File | 48 entries |
| ROB size | 48 |
| L1 cache | 32KB, 4-way |
| L2 cache | 256KB |
FIG. 2.15

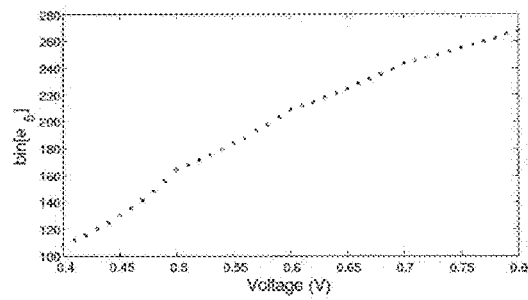
FIG. 2.11(a)
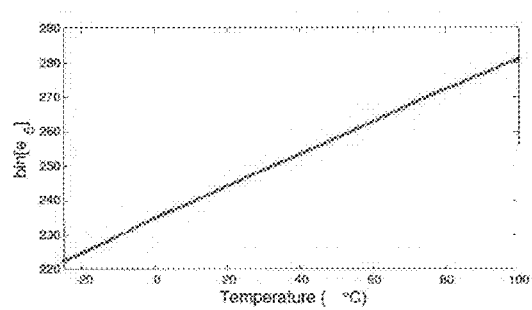
FIG. 2.11(b)
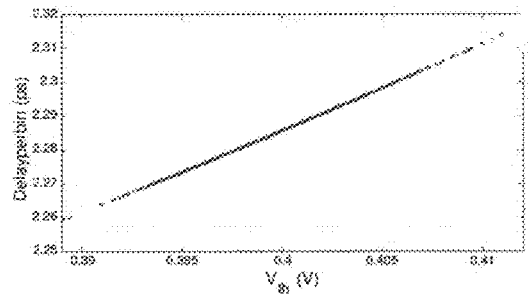
FIG. 2.11(c)
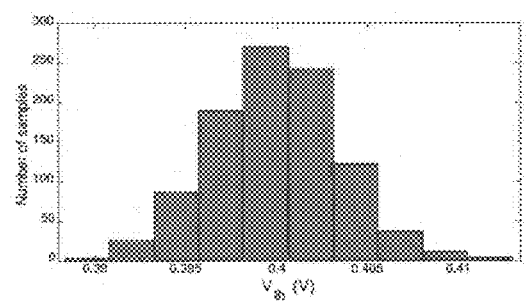
FIG. 2.11(d)
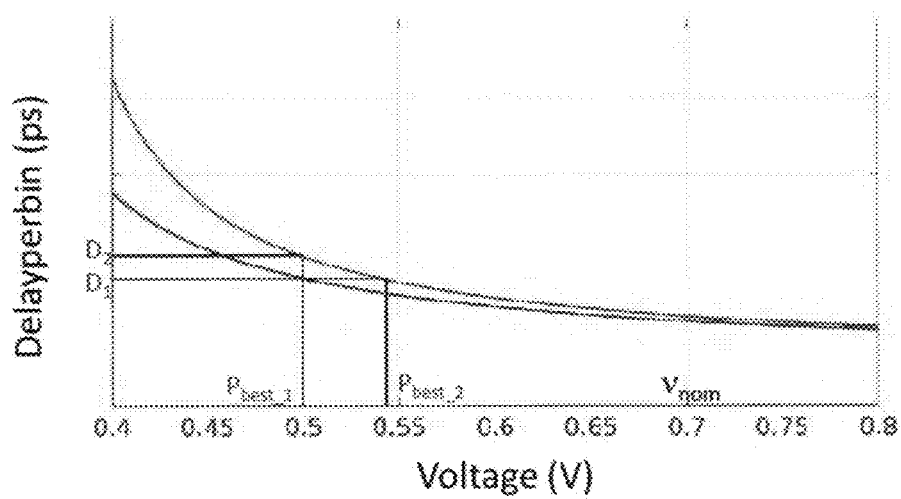
FIG. 2.12

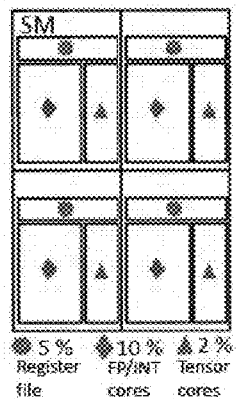 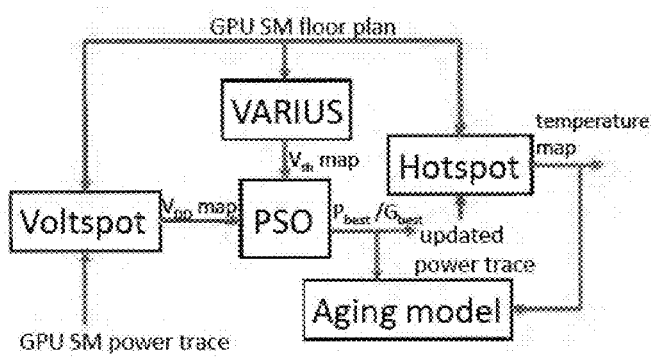
FIG. 2.13 (a)            FIG. 2.13 (b)
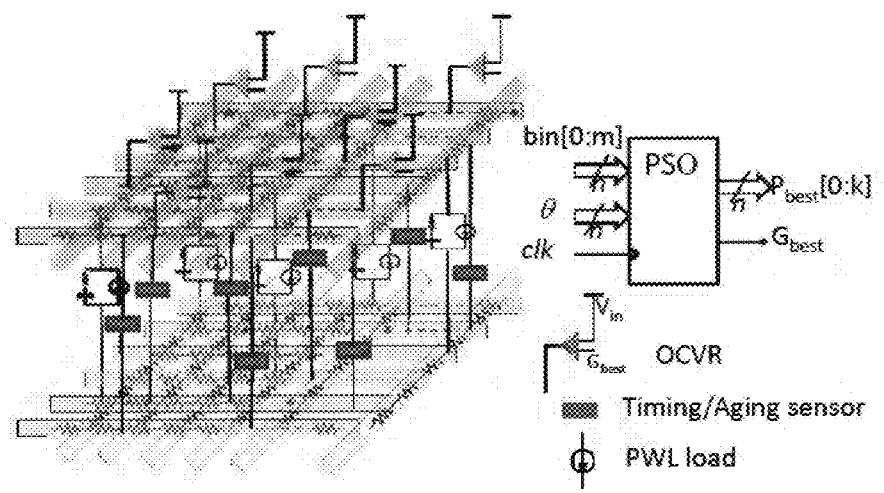
FIG. 2.14

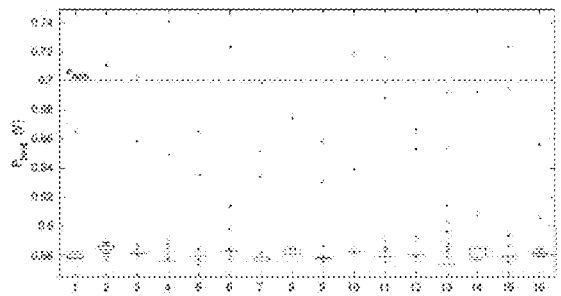
FIG. 2.16 (a)
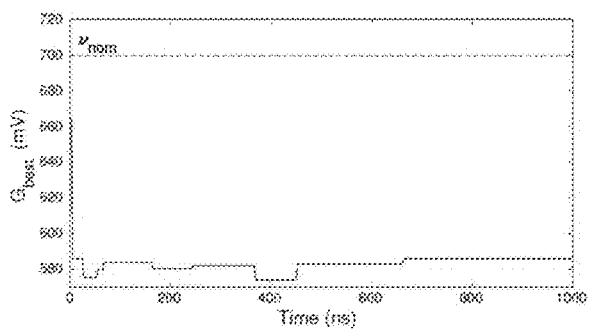
FIG. 2.16 (b)
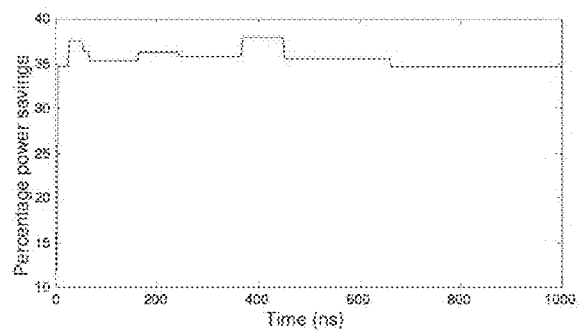
FIG. 2.16 (c)
TABLE III: Technology and power-law fitting parameters [33] used in the aging model.
| Parameter | Description | NMOS | PMOS |
|---|---|---|---|
| $\gamma$ | power-law exponent | 3.2 | 3 |
| $\alpha$ | power-law exponent | 0.158 | 0.173 |
| A | fitting constant | 3.12e-2 | 2.02e-2 |
| $\beta$ | fitting constant | 0.667 | 0.667 |
| $\kappa$ | fitting constant | 50 | 50 |
FIG. 2.18

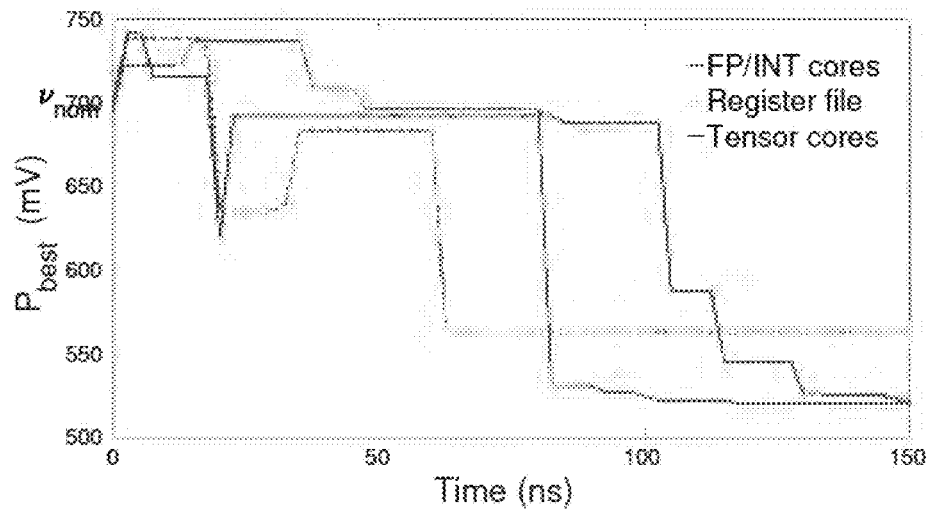
FIG. 2.17 (a)
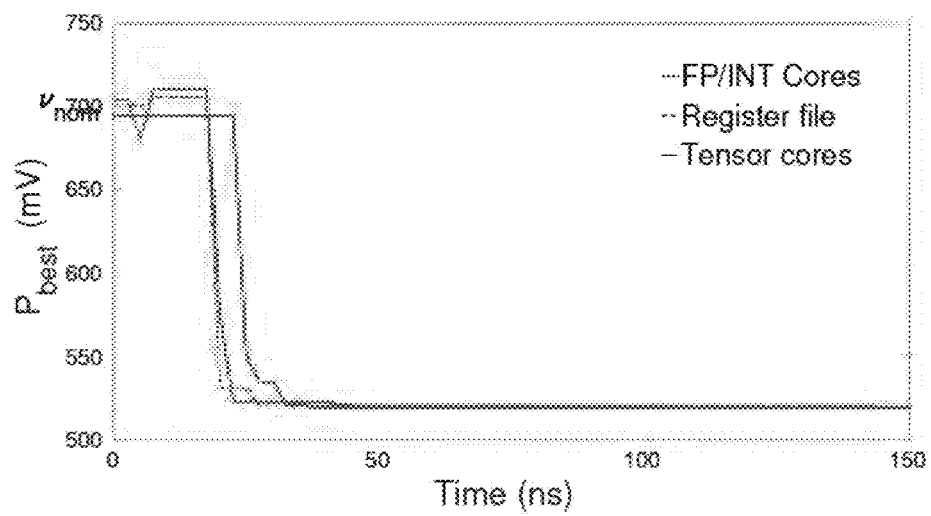
FIG. 2.17 (b)

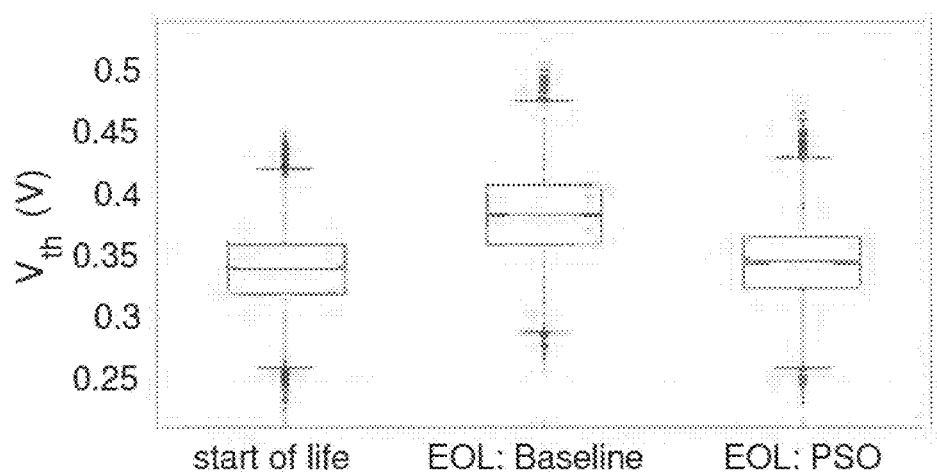
FIG. 2.19 (a)
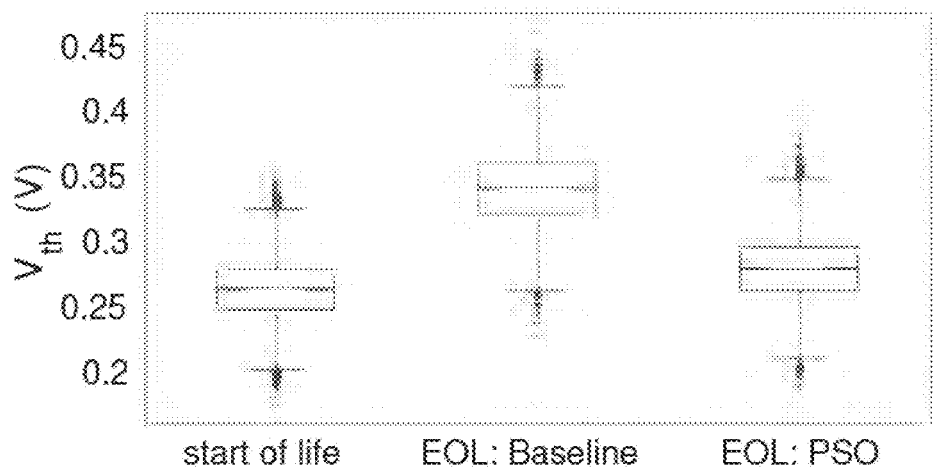
FIG. 2.19 (b)

TABLE IV: Analysis of the temperature of the functional blocks for the SM with voltage assignment through PSO as compared to a baseline implementing off-chip voltage regulators.

| Functional unit | Average percentage reduction in the assigned voltage | Percentage reduction in temperature | | |
|---|---|---|---|---|
| | | Min | Max | Mean |
| RF | 19.1 | 2.9 | 5.7 | 4.7 |
| FP/INT cores | 21.4 | 3.4 | 7.2 | 6.1 |
| Tensor cores | 22.1 | 2.3 | 5.1 | 4.2 |

FIG. 2.20

TABLE V: Circuit and computation overhead to implement the run-time PSO.

| Parameter | Value |
|---|---|
| On-chip memory for LUT | 512 B |
| Execution time of the PSO procedure in Algorithm 1 | 20 clock cycles per OCVR |
| Aging sensors [58] in 12 PCPs | 2K transistors |
| 16 latched tapped delay lines [55] as timing sensors | 6K transistors |

FIG. 2.21

ON-CHIP VOLTAGE ASSIGNMENT THROUGH PARTICLE SWARM OPTIMIZATION

STATEMENT REGARDING GOVERNMENT SUPPORT

This invention was made with government support under Contract No. CNS-1648878 awarded by the National Science Foundation. The government has certain rights in the invention.

BACKGROUND

The design of a power distribution network (PDN) for technologies preceding the sub-nanometer node was based on optimization of a static voltage margin. A fixed-voltage margin or guard band was added to the power-supply voltage to compensate for the voltage variation due to noise induced by current drawn through the parasitic impedance of the PDN in the integrated circuit, package, and board in addition to the finite IR drop from the voltage regulator to the load circuits. In the sub-nanometer nodes, the increased process variability, complex power-thermal interactions, and most importantly the reduced voltage margin between the transistor operating voltage and threshold voltage requires novel methodologies to properly design the PDN. The variation in the local threshold voltage Vth, bias temperature, instability, and random telegraph noise have increased significantly with technology scaling.

Fin field-effect (FinFET)-based designs suffer from self-heating and offer high current density. This leads to higher dynamic power, power noise, and thermal density. Electromigration in the PDN is a growing concern for such circuits. Power management techniques such as power gating increase the inrush current and, therefore, the power supply noise. Optimization of decoupling capacitors alone does not effectively address the increased power supply noise. In addition, with the advent of FinFET processes, the impact of process variation is not fully understood due to the limited availability of production data on these nodes. Post silicon methods to compensate for process variation such as speed binning and voltage binning are tedious and expensive. The binning process does not account for process variation within processor cores in a die.

Due to the complex interdependence of the various challenges faced in delivering power in sub-nanometer technology nodes, robust and cost effective PDNs using existing pre-silicon design techniques have not been regularly designed. More recently, machine learning (ML) based techniques have been applied to the design of the PDN to minimize the routing resources while meeting the constraints for IR drop and electromigration. Another approach to use ML algorithms for the design of the PDN is to leverage the power profile from a previous circuit to design the PDN of a current circuit. The two circuits may differ in functionality, but learning algorithms capture features of the circuits as well as the physical properties of the silicon to execute an informed decision that optimizes the PDN. However, ML techniques applied to the PDN during the design phase cannot mitigate the impact of circuit aging, self-heating, and power supply noise at run-time. To effectively address the challenges faced in power delivery for advanced technology nodes, a run-time learning technique is needed for reliable and cost and energy efficient power delivery.

SUMMARY OF THE EMBODIMENTS

A distributed power management scheme may encompass a range of circuit families including server class high performance processor cores, computing cores for mobile applications, hardware accelerators for deep neural networks (DNN), network on chip (NoC) routers, and for large clusters of IoT sensor nodes. An on-chip PDN with distributed on-chip voltage regulators, distributed timing sensors, and a power management unit(s) (PMU) may also be used with the scheme. The on-chip PMU self-learns and regulates the local voltages intelligently and autonomously to minimize the voltage guard-band without inducing any timing failure. The sensing, decision, and actuation performed by the PMU are implemented at the circuit level.

The potential critical paths (PCPs) in a voltage domain comprising one or more processing cores may include specialized circuits embedded in each PCP that detect degradation in the delay of PCPs. One potential integrated timing sensor, the latched taped delay line, may be used as a calibrated voltage sense circuit in conjunction with distributed voltage regulators. The calibrated timing to voltage values may be stored in on-chip memory at the beginning of the product life and the re-calibrated values stored at each delay violation in any PCP until the end of life of the product may be indicated through the delay sensors in the PCP.

The PMU may execute a particle swarm optimizer (PSO) to determine the optimal local voltages and an optimal global voltage to be applied to the voltage domain. The local voltages may be applied independently to the voltage regulators or a common global voltage may be applied to all regulators. The local voltages provided by the PSO account for local phenomenon (events that cause fluctuations in the grid voltage) in the vicinity of the voltage regulators and compensate for timing variation sensed by the timing sensors due to complex interactions from local process, temperature, aging, IR drop, and Ldi/dt events. The global voltage provided by the PSO is the lowest voltage level needed across the voltage domain to maintain a positive timing margin across all PCPs. The tuning parameters of the PSO are used to emphasize local or global voltage level selection, which include the effects of voltage noise induced by spatially distant circuit elements.

BRIEF DESCRIPTION OF THE DRAWINGS

FIG. 1.1 shows a pre-silicon design process.
FIG. 1.2 shows a post-silicon calibration and voltage assignment process.
FIG. 1.3 shows a functional block diagram of the PSO.
FIG. 1.4 shows the connectivity and flow diagram for the PSO.
FIG. 1.5 shows Algorithm 1.
FIGS. 1.6, 1.7, and 1.8 show the computed Pbest, Gbest, and timing margin in voltage domain with 20 distributed voltage regulators, 20 time-based sensors, and five PCPs.
FIG. 2.1 shows an NVIDIA Volta GV100 floorplan with 84 streaming multiprocessors overlaid on a map of 0.9% a/p variation in Vth for a 10 nm FinFET HKMG technology.
FIGS. 2.2(*a*) and (*b*) show impact of BTI on a PMOS FinFET fabricated in a 10 nm or below HKMG process through characterization of FIG. 2.2(*a*) the shift in Vth over a stress period of ten years and an operating temperature of 80 C, and FIG. 2.2(*b*) the degradation in the drain to source current (IPMOS) of a digital LDO with stress time and operating temperature assuming an activity factor of 50%.

FIG. 2.3 shows F04 delay variation of an inverter chain with operating temperature and power supply voltage for a 7 nm PTM FinFET technology. The TEI phenomenon is depicted as an inverse dependence of the delay with temperature.

FIG. 2.4 shows reduction in the peak temperature (Joule heating) of a 15 nm FinFET technology with power supply voltage scaling.

FIG. 2.5 shows environmental and circuit effects that impact the power integrity of sub-20 nm FinFET based ICs utilizing distributed on-chip voltage regulators.

FIG. 2.6 shows distributed on-chip voltage regulators for a given voltage domain. The reference voltages to the distributed voltage regulators is obtained through the on-line particle swarm optimizer. The functional units of a typical SMT processor are shown as the load circuits in the voltage domain. The timing sensors are distributed across the domain to guide the PSO.

FIGS. 2.7(a) and 2.7(b) show assignment of a new voltage (position) to each OCVR (particle) shown through a FIG. 2.7(a) functional block diagram of the PSO algorithm and a FIG. 2.7(b) vector diagram.

FIGS. 2.8(a) and 2.8(b) show a latched tap delay line in a 7 nm PTM FinFET technology used as the timing sensor where FIG. 2.8(a) depicts the circuit schematic of the sensor and FIG. 2.8(b) the output of the latches capturing the shift in the clock edges due to an increase in VDD.

FIGS. 2.9(a) 2.9(b), and 2.9(c) show an aging sensor built into each potential critical path (PCP) where FIG. 2.9(a) depicts a block diagram of the primary circuit components, FIG. 2.9(b) a circuit schematic of the sensor, and FIG. 2.9(c) a timing diagram depicting the detection of a violation due to aging.

FIG. 2.10 shows Table I.

FIGS. 2.11(a) to (d) show response of the timing sensor at start of life with variation in FIG. 2.11 (a) VDD (at T=25C and Vth=0.34 V), FIG. 2.11(b) operating temperature (at VDD=0.7 V and Vth=0.34 V), and FIG. 2.11(c) intra-die Vth with a coefficient of variation a/p of 0.9%. The distribution of Vth for a a/p1 of 0.9% is provided in FIG. 2.11(d).

FIG. 2.12 shows an illustration of determining a new voltage each time the calibration procedure is invoked due to a flag raised by an aging sensor. The assigned new voltage results in the same delay per bin in the timing sensor as observed with the previous calibration.

FIGS. 2.13(a) and (b) show simulation infrastructure to validate the PSO based voltage assignment algorithm where FIG. 2.13(a) depicts the floorplan of a SM used as an input to Voltspot and Hotspot and FIG. 2.13(b) shows the data flow diagram depicting the data parsed between the various tools used to characterize the PSO algorithm.

FIG. 2.14 shows a model of the circuit used for SPICE simulation of a voltage domain that includes a circuit implementation of the PSO algorithm for voltage assignment of distributed OCVRs.

FIG. 2.15 shows Table II.

FIGS. 2.16(a)-(c) show results from the PSO based power supply voltage assignment algorithm for a voltage domain with 16 OCVRs. The voltage domain consists of gates from a 7 nm PTM process. The nominal voltage vnom for the transistors is 0.7 V. Included are the characterization of FIG. 2.16(a) the best voltage assignment per OCVR, FIG. 2.16(b) the global best voltage with time, and FIG. 2.16(c) the reduction in power consumption when applying the adaptive global voltage to the given voltage domain as compared to an assignment of vnom.

FIGS. 2.17(a) and 2.17(b) show characterization of the effect of the personal (c1) and social acceleration (c2) coefficients on the decision of the PSO (for varying circuit activity of the functional blocks). The evolving reference voltage assignment to a sub portion of a SM with three OCVRs is shown. The change in Pbest applied to the OCVRs supplying the FP/INT cores, register file, and tensor cores is shown for decreasing levels of circuit activity for FIG. 2.17(a) c1=c2=2, and FIG. 2.17(b)c1=0,c2=2.

FIG. 2.18 shows Table III.

FIGS. 2.19(a) and 2.19(b) show the reduction in aging induced degradation of Vth through adaptive voltage assignment to 12° C. VRs integrated in a SM modeled on the NVIDIA Volta GV100 in a 7 nm FinFET process using FIG. 2.19(a) high-Vth and FIG. 2.19(b) low-Vth transistors. The end of life (EOL) in all cases is ten years.

FIG. 2.20 shows Table IV.

FIG. 2.21 shows Table V.

DETAILED DESCRIPTION OF THE EMBODIMENTS

The following detailed description is illustrative and is not intended to limit embodiments and/or applications of the embodiments.

1. On-Chip Voltage Assignment Through Particle Swarm Optimization

The advent of multi-core and many-core platforms with heterogeneous architectures has introduced challenges for dynamic power management. A heterogeneous architecture offers higher energy efficiency for performance intensive data centers executing deep learning workloads. The power delivery through on-chip voltage regulators for heterogeneous many-cores, however, introduces some obstacles. Improved energy efficiency may be achieved through heterogeneous distributed on-chip voltage regulators (OCVRs) and interconnected PDNs but high and sustained current demand in GPUs subjects the OCVRs to aging and higher susceptibility to process variation and noise. In addition, large dI/dt events in the GPU and large cores may lead to power supply noise due to the finite latency of OCVRs to react to changes in the load current State of the art GPUs currently operate with off-chip voltage regulators that may lead to higher reaction latency to changes in load current. In addition to high performance CPUs and GPUs, domain specific ASICs may develop to accelerate deep learning applications such as the Google tensor processing unit (TPU) also require advanced run-time power management to mitigate timing errors due to PVT and aging. Deep neural networks (DNNs) have been posited as being robust against PVT variations but they may not be, while DNNs with large systolic array multipliers such as the TPU along with error resilient circuit techniques may improve energy efficiency through per layer voltage scaling.

Existing power management schemes for multi-core systems employ a central power management unit (PMU) that controls the operating voltage (and frequency for DVFS) for the cores and the core connectivity fabric. The decision to scale the voltage and frequency may be executed by the operating system. The PMU may provide the on-chip sensor data (voltage, current, and operating temperature) to the operating system governor. In addition to the physical sensor data, the activity counters implemented in the architecture of the processor may provide guidance on the appropriate operating voltage and frequency to the governor. A centralized power management scheme may not scale well as the number of processors in an IC increases.

Learning-based power management methods may use supervised learning or reinforcement learning to characterize the workload power and performance demands on a many-core architecture and apply DVFS or advanced power modes to the cores. Reinforcement learning, which permits the system to adapt to the changing conditions of the environment, has been used for dynamic power management and DVFS. Prior work on on-line learning methods for application of DVFS rely on architecture level performance counters. Performance counters may be used to determine the type of workload, where a high activity factor implies execution of a large number of CPU operations and a low activity factor indicates either a larger number of memory access operations or CPU idling.

In the evolvable PDN for many core systems with a combination of core architectures, GPUs, and accelerators, an on-line learning algorithm for dynamic power mode management may be developed. Sensors that detect timing margin violations on the critical paths of the circuit may provide information to the on-line learning algorithm. Direct communication of the circuit sensory information with the system may reduce the execution latency for power modes including DVFS and increase the accuracy of the prediction of the optimal voltage and frequency for a given workload.

An evolvable PDN may address vulnerabilities to timing errors with an operating voltage set with a reduced guard band. An learning algorithm (online or not) may be a discrete particle swarm optimizer (PSO) that offers a robust and simple implementation compared to other evolutionary algorithms. A PSO may offer different routes through the problem hyperspace as compared to genetic algorithms and other methods. The low overhead to store the results during each iteration and the simplicity of the implementation may make the PSO algorithm an ideal candidate for run-time control of the power supply voltages.

The PSO may operate on a set of particles p1, p2, ..., pn, where the position of each particle $x_i$ in a D dimension hyperspace represents a potential solution to the optimization problem. For a given particle $p_i$, the position and velocity at time t are represented, respectively, as $x_i(t)=(x_{i,1}(t), x_{i,d}(t), \ldots, x_{i,D}(t))$ and $v_i(t)=(v_{i,1}(t), v_{i,d}(t), \ldots, v_{i,D}(t))$. The current best position for particle $p_i$ is recorded as $P_{best}=(P_{i,1}(t), P_{i,d}(t), \ldots, P_{i,D}(t))$. The best position among the entire particle population is recorded as $G_{best}=(G_{i,1}(t), G_{i,d}(t), \ldots, G_{i,D}(t))$. The velocity and position of a particle are constantly adjusted according to the experiences of the particle and experiences of the other particles in the swarm. The velocity and position of the particles is updated as per equations 1.1 and 1.2, respectively. In equation 1.1, ω (or wherein) is the inertia weight, φ1 and φ2 are the learning factors, and $\rho_1$ and $\rho_2$ are random functions in the range [0,1].

$$v_{i,d}(t+1)=\omega \times v_{i,d}(t)+\phi_1 \times \rho_1 \times (P_{i,d}(t)-x_{i,d}(t))+\phi_2 \times \rho_2 \times (G_{i,d}(t)-x_{i,d}(t)) \quad (Eq. 1.1)$$

$$x_{i,d}(t+1)=x_{i,d}(t)+v_{i,d}(t+1) \quad (Eq. 1.2)$$

The inertia weight ω is applied to control the influence of past velocities on the current velocity of a particle. A large ω enables wider hyperspace exploration, whereas a small value facilitates more local exploration to fine tune the current search results. A linear decrease in w with time (decreasing ω-strategy) yields near optimal results with least iterations. The cognitive parameter φ1 sets the weight given to the prior velocity of a particle when determining the current velocity. The social parameter φ2 sets the weight given to the swarm for determining the new velocity of the particle. The values for ω, φ1, and φ2 therefore, determine the procedure for exploration of the hyperspace D. The particle swarm optimization algorithm is shown in FIG. 1.5.

The voltage guard-band optimization problem for a given voltage domain with distributed on-chip voltage regulators is formulated as described by equations (3), (4), (5), and (6).

$$\text{Maximize } \eta_{energy}=f(\theta_1, \theta_2) \quad (Eq. 1.3)$$

$$\text{s.t. } VID_{min} \leq \theta_1 \leq VID_{max} \quad (Eq. 1.4)$$

$$V_{min} \leq \theta_2 \leq V_{max} \quad (Eq. 1.5)$$

$$T_{margin}=g(\theta_2) \geq 0 \quad (Eq. 1.6)$$

The objective function may maximize the energy efficiency of the given voltage domain. The energy efficiency $\eta_{energy}$ may be a function of the control variable $\theta_1$ and dependent variable $\theta_2$. The control variable $\theta_1$ represents the discrete reference voltage $V_{ref}$ assignments to the OCVRs $p_i$ and the dependent variable $\theta_2$ represents the continuous output voltages of the OCVRs. In a two-tiered configuration of the on-chip power delivery network, the input voltage to the OCVRs can be included as a dependent variable to the optimization problem. The constraint given by equation 1.4 restricts the range of the reference voltage assignments to the programmable VID levels in the voltage reference control circuit. The constraint given by equation 1.5 restricts the range of the output voltage of a domain to the limit in the operating voltage of the MOS transistors set by the fabrication technology. The constraint given by equation 1.6 restricts the timing margin sensed from the distributed timing sensors to a positive value. The timing margin of a critical path is inversely proportional to the operating power supply voltage 02.

The distributed OCVRs operate as a swarm to locally optimize the operating voltage with the smallest guard-band needed to prevent timing violations on the local critical paths as well as to compensate for aging related degradation in both the load and OCVR circuits. The optimization may be achieved through the computation of Pest and Gbest, through calculations of, respectively, equations 1.7 and 1.8. The Pbest of a particle (OCVR), which defines the lowest voltage that meets all timing constraints for the region of the circuit supported by the given particle, is a function of the sensed timing margin from the nearest timing sensor. The timing margin may be a function of the local operating voltage, which includes the effects of noise and circuit aging.

The Pbest may provide the local optimal point of the load circuits. The sensed timing margin may include the voltage variation due to local aging of both the load and the source (OCVR) as well as temporal effects such as noise. The Gbest value is the maximum value of the personal best values (Pbest) of all the particles.

$$P_{best}=f(V_{min}(t), Aging(t), \Delta Vth_{gr1}(t), \Delta Vth_{PV}(t), W_{load}(t)) \quad (Eq. 7)$$

$$G_{best}=\max(P_{best}) \quad (Eq. 8)$$

FIG. 1.1 shows the steps needed during the design of the system with multiple processing cores. Existing statistical static timing analysis tools are used to determine a set of timing paths that have high delay and statistically can evolve as the paths with maximum delay in a given voltage domain 110. This set of timing paths is termed as potential critical paths (PCPs). A timing margin violation sensor is integrated within each PCP, which may modify PCPs with timing margin violation circuits 120. The layout of the distributed voltage regulators and time-based sensors may then be frozen with respect to the distribution of the PCPs 130.

The post-silicon process to execute the PSO is shown in FIG. 1.2. At the first power up of the system, the distributed time-based sensors are calibrated 210 across the supported voltage and frequency ranges of the system while running a known workload 230 that produces the lowest variation in activity factor after the PSO is initialized 220. The calibrated timing bins for each sensor at each frequency may be stored in the on-chip RAM as a look up table (LUT). The calibrated values represent the highest supported voltage at a given operating frequency. Due to intra-die process variation, the calibrated bins may vary for each time-based sensor. The LUT may be accessible to the on-line PSO, which compares the new time-based sensor output with the calibrated data in the LUT.

As long as there is no timing margin violation flag 240 (tf$_i$ in FIG. 1.3 and FIG. 1.4) raised in any of the PCPi and the captured timing bins are lower than the calibrated bins, the Pbest position is updated. In case of a timing margin violation in any PCPs, a recalibration of the time-based sensors is performed. The inputs and outputs to the on-chip PSO block are shown in FIG. 1.3 and include as inputs Bin[0:m], tf, and clk, and as outputs Pbest and Gbest.

The connectivity between the two procedures within the PSO algorithm are shown in FIG. 1.4, with steps and abbreviations noted as discussed above.

The Pbest and Gbest values may evolve with time as the system ages and with changes in environmental conditions. The compound effect of aging/environment in the load circuits, voltage regulators, and the time-based sensors may be negated through the computed voltages by the PSO. With no time margin guard-band violations, the assigned voltage(s) may mitigate the formation of thermal hotspots. As the system ages based on the workloads executed and environmental conditions, a number of recalibrations of the sensors may be performed until there is no further possibility of voltage reduction at a given frequency. Further operation of the system may lead to timing violations and the lifetime of the system can be enhanced through frequency reduction (performance impact) or higher voltage (energy impact). During the normal operational life of the system, energy savings may be compounded due to an evolving operating voltage that yields the smallest timing margin with no performance penalty. The computed Pest, Gbest, and timing margin in a voltage domain with 20 distributed voltage regulators, 20 time-based sensors, and five PCPs are shown in, respectively, FIG. 1.6, FIG. 1.7, and FIG. 1.8.

2. EVOLVING ON-CHIP POWER DELIVERY THROUGH PARTICLE SWARM OPTIMIZATION 2.1. Introduction This section 2 describes and expands upon what was described in Section 1, with an understanding that the sections are complementary to one another.

The design of the power distribution network may be based on the optimization of a static voltage margin. A fixed voltage margin or guard-band is added to the power supply voltage to compensate for noise induced by the current drawn through the parasitic impedance of the PDN of the integrated circuit, package, and board in addition to the finite IR drop from the voltage regulator to the load circuits. In sub-20 nm nodes, the increase in process variation, the complex power-thermal interactions, and, most importantly, the reduced voltage margin between the transistor operating voltage and threshold voltage may use novel methodologies for the correct design of the PDN.

In addition to technology scaling, FinFET based circuits may result in higher current densities, which leads to an increase in dynamic power consumption, voltage noise, and thermal density. Electromigration within the interconnect of the PDN is a growing concern for FinFET based circuits. Power management techniques such as power gating may increase the inrush current, and therefore, the power supply noise. Optimization of decoupling capacitors alone may not effectively address the increased power supply noise.

Due to the complex interdependence of the various design challenges faced to properly and efficiently deliver power in sub-20 nm technology nodes, it is difficult to produce a robust and cost effective PDN using existing design techniques. Techniques based on vector-less peak power lead to an overcompensated and expensive PDN. Vector or stimulus based PDN design with analysis of the peak power consumption provided through emulators may be computationally expensive. Machine learning (ML) based techniques have recently been applied to the design of the PDN to minimize the required routing resources while meeting the constraints for IR drop and electromigration. Another approach that utilizes ML algorithms for the design of the PDN leverages the power profile from a prior completed circuit to design the PDN of a current circuit. The two circuits may differ in functionality, but learning algorithms capture the physical characteristics of the circuits to effectively execute an informed decision that optimizes the PDN. With the rapid advancement in ML techniques, the objective is to replace decisions in the design of an integrated circuit made based on human experience with ML algorithms. However, ML techniques applied to the PDN during the design phase cannot mitigate the impact of circuit aging and power supply noise at run-time.

To effectively address the challenges faced in the delivery of power to circuits in advanced technology nodes, a run time learning technique may be needed for reliable and cost and energy efficient power delivery. For this, an evolving on-chip voltage assignment may be implemented with distributed OCVRs. The on-chip PDN self-learns and regulates the local voltages intelligently and autonomously to minimize the voltage guard-band without inducing any timing failures. Latched tap delay lines are integrated to sense the variation in the timing margin of critical paths, providing the collected data to the on-line learning algorithm. The data from the circuit-level sensor is directly provided to the system to reduce the execution latency of power modes including DVFS and increase the accuracy of the prediction of the optimal voltage and frequency for a given workload.

The system and method herein describe at least

The development of a circuit technique for the adaptive voltage assignment to processing elements. The evolving voltage assignment is implemented with distributed on-chip voltage regulators of which the reference voltage is set through a particle swarm optimizer.

The run time assignment of the power supply voltage compensates for the majority of second order effects limiting the reliable operation of processing cores developed in sub-20 nm technologies with 3-D multi-gate transistors.

The application of machine learning at run time for the power management of processing elements that is contained in the circuit layer. Prior work on machine learning techniques for on-chip power delivery are applied during the design phase of a circuit. Alternatively, machine learning techniques for power management and/or energy efficiency that execute partially at run-time rely on system or architectural level data for learning and inference.

2.2. Power Integrity for Sub-Nanometer Technologies

This section describes the power integrity in many core systems fabricated in advanced sub-20 nm technology nodes. Existing challenges including process variation, temperature related performance degradation, aging, and power supply noise are exacerbated. In addition, unique effects due to the use of FinFET technology such as self-heating and temperature effect inversion (TEI) impact circuit performance. Each of the challenges and the interrelationship amongst them, which evolve with time, is described in detail.

2.2.1. Nanometer Scale Field Effect Transistor Technology

From the invention of the field-effect transistor (FET) in 1925 by Julius Edgar Lilienfeld, FET technology has evolved at a rapid pace over the past eighty years. The metal oxide semiconductor FET (MOSFET) is the foundation of computing systems, which makes MOSFETs one of the primary inventions of the 20th century.

The scaling of the MOSFET to nanometer scale dimensions may introduce short channel effects that degrade the carrier mobility and the drain current. In addition, the voltage applied to the gate may no longer fully control the channel, leading to excessive sub-threshold leakage current, which translates to higher power dissipation. To mitigate the subthreshold leakage, two MOSFET structures have gained traction, the silicon on insulator (SOI) transistor and three-dimensional transistors such as FinFETs. SOI and FinFETs are two solutions to simultaneously maximize gate-to-channel capacitance and minimize the drain-to-channel capacitance of a MOSFET.

The SOI MOSFET may include a buried oxide layer, which isolates the body from the substrate. The isolation of the transistor body from the substrate may reduce the parasitic capacitance and the leakage current to the substrate. Fully depleted SOI (FDSOI) devices have thin (5 nm to 20 nm) body structures and FD-SOI technology offers superior sub-threshold characteristics with low leakage current as well as a reduced drain to source capacitance, which results in a reduction in the delay and dynamic power consumption of the transistor.

A FinFET structure uses a double gate structure to enhance the control of the channel. The current three-dimensional structure of the FinFET has a thin vertical fin of silicon surrounded by the gate on either two or three sides. The effective width of the channel is, therefore, a function of the fin height. To provide greater drive strength, the fin height may be increased. Alternatively, multiple fins implemented in parallel and connected through a common gate also offers a higher drive strength.

For nodes smaller than 22 nm, designs may use either SOI or FinFET technologies due to the various design and manufacturing trade-offs. Although SOI offers less manufacturing complexity due a compatibility with bulk MOSFET, the cost of the SOI wafer is higher than that of a FinFET wafer. In addition, FinFETs may offer higher drive current as compared to SOI.

2.2.1.1 Process variation: The stochasticity of the manufacturing process of an integrated circuit has been studied. Each new process node developed by a foundry may require detailed analytical and experimental validation to quantify the variation in parameters due to the fabrication process. The effect of process variation is addressed by adding either (or both) timing margins and voltage margins to respectively, the maximum operating frequency and the minimum operating supply voltage. The margins also account for the predicted degradation in circuit performance due to aging over the lifetime of the IC. The use of margins may limit the benefits in power and performance possible with technology scaling.

An analysis of the required power supply voltage of GPU streaming multi-processors (SMs) for a 5% variation in the ratio of the standard deviation $\sigma$ over the mean $\mu$ ($\sigma/\mu$ ratio) for the threshold voltage Vth may be performed. Results of the study indicate that regions of the GPU most susceptible to process variation may operate at a 25% higher voltage than regions robust to variation. A similar analysis of the NVIDIA GV100 GPU is performed. The GV100 die size may be 815 mm$^2$ with over 21 billion transistors fabricated in a TSMC 12 nm FinFET process. There may be 84 SMs on the die. Assuming a similar floor plan and die configuration in a 10 nm HKMG process, the variation in the Vth across the die is shown in FIG. 2.1. A modest 0.9% a/p ratio with a spatial correlation range cp of 0.2 may be assumed. As indicated by results shown in FIG. 2.1, there is significant inter and intra SM variation in the threshold voltage. The GV100 does not support on chip voltage regulation and, therefore, includes twelve off-chip voltage regulators. The structural complexity of the PDN for the different voltage domains may not be provided. Given the possibility of high variation in the operating voltage and frequency of the SMs, distributed on-chip voltage regulation with run-time power management is needed for state-of-the-art GPUs as well as other many-core architectures 2.2.1.2 MOS transistor aging: The performance of MOS transistors may be affected by physical phenomenon. Specifically, bias temperature instability, time dependent dielectric breakdown, and hot carrier injection may impact a circuit as it ages. In literature, these phenomena are often investigated in isolation. The impact on the on-chip DC-DC voltage regulators and the load circuits due to MOS transistor aging is, therefore, discussed below.

2.2.1.2.1 Bias temperature instability: Among the multiple reliability issues, transistor aging due to negative (positive) bias temperature instability NBTI (PBTI) may be a primary failure mechanism. NBTI (PBTI) has emerged as the dominant aging effect in advanced technology nodes below 65 nm. A negative (positive) voltage applied to the gate of the PMOS (NMOS) transistor results in an increase in the threshold voltage Vth, which degrades the drain current, and therefore, the transconductance of the PMOS (NMOS). The phenomenon is termed as NBTI (PBTI). MOSFET circuits, therefore, exhibit a degradation in the delay with time, with more than 20% degradation due to BTI may be seen. The effect of BTI on a circuit depends on several factors including operating temperature, workload activity, applied voltage, and the total active time of the circuit. The BTI effect significantly reduces the lifetime of a CMOS transistor. With time, the critical path delay may exceed the timing constraint, which leads to timing failure.

Two mechanisms may contribute to the gradual increase in the threshold voltage of the device:

(1) Weak Si—H bonds at the SiO2 interface break due to the high vertical electric field. The break of the bond releases hydrogen atoms that diffuse into the gate oxide leaving an interface trap. The generated traps capture charge carriers that have tunneled into the oxide.

(2) Charge carriers are captured via tunneling in pre-existing defects at the gate oxide interface with the silicon or within the gate oxide itself. When the device is turned off, some of the activated defects may be annealed, which leads to partial recovery of the threshold voltage. Current methods to characterize and address the BTI effect include 1) analysis and modeling of BTI in the pre-silicon phase, 2) input vector control and power gating techniques, and 3) runtime techniques such as computational sprinting at an elevated power supply voltage followed by power gating to recover rom BTI.

The NBTI induced degradation in the Vth of a PMOS transistor in a 10 nm HKMG process is shown in FIG. 2.2(*a*). An operating temperature of 80-C and a duty cycle of 50% are assumed to compute the variation in the mean and standard deviation of the Vth. Not only does the mean of the Vth increase due to NBTI, the variance at the start of life attributed to process variation also increases with time and operating temperature. The increase in the Vth results in a reduction in the maximum operating frequency of the processing elements (the cores or circuit sub-blocks) and also a degradation in the line and load regulation offered by the distributed OCVRs. The percentage reduction in the drain to source current of the header PMOS (IP MOS) in a conventional LDO is shown in FIG. 2.2(*b*). The reduction in the performance of the load circuit and the degradation of the maximum load current supported by the OCVRs differ due to disparities in stress time, spatial variation in Vth and temperature, and transistor duty cycle. Therefore, a design time model of aging induced variation is not accurate to compensate for the runtime performance loss of a system operating at a fixed power supply voltage.

2.2.1.2.2 Time dependent dielectric breakdown: Time dependent dielectric breakdown (TDDB) is a phenomenon that occurs due to the wear out of the gate dielectric with time. The degradation of the gate dielectric results in a conducting path through the transistor gate, which leads to a permanent short.

With an increase in the operating voltage and temperature, the mean time to failure (MTTF) may decrease. The mathematical model that best approximates the MTTF due to TDDB is given by Equation 2.1. The MTTF is a function of the gate to source voltage $V_{gs}$ applied to the transistor, the operating temperature T, the duty cycle D, and the fitting parameters a, b, X, Y, and Z. The fitting parameters are constants with values a=78, b=−0.081, X=0.759ev, Y=−66.8 evK, and Z=−8.37E-4ev/K provided for a reliability aware microprocessor model. The $MTTF_T$-DD from the model exhibits exponential degradation with temperature. Due to the 3-D fin structure, multi-gate FinFETs have lower heat dissipation, leading to reduced MTTF.

$$MTTF_{TDDB} \propto \left(V_{gs}^{(-a+bT)} \times e^{\frac{X+Y/T+ZT}{kT}}\right)^{-1} \quad \text{(EQ. 2.1)}$$

2.2.1.2.3 Hot carrier injection: Hot carrier injection (HCl) occurs when electrons are accelerated by a high electric field in the channel of a device such as near the drain of a MOSFET. The accelerated electrons, termed as hot, damage the gate oxide, which results in trapped charges. With time, the accumulation of charge due to hot electrons leads to an increase in the threshold voltage of the MOSFET. HCl is a widely studied phenomenon in bulk CMOS devices and persists in sub-20 nm FinFET devices. Studies on FinFET transistors indicate significant degradation in NMOS characteristics due to HCl as compared to PBTI.

2.2.1.3 Transient faults: Challenges in signal and power integrity include single and multiple transient faults that occur during the operational lifetime of a circuit. There are two categories of transient faults: 1) radiation effects (single event transient/upset) and 2) random telegraph noise (RTN).

Research has shown that technology scaling results in increased susceptibility to single event upsets due to radiation, though the single error rate does not increase significantly. RTN, however, is considered the primary transient noise source as technology scales. The cause of RTN is the trapping and de-trapping of charge carriers at the interface of the silicon with the gate insulator, which is an intrinsic quantum process. A single trapped charge carrier can lead to RTN. With technology scaling, the thickness of the gate insulator of MOS/FinFETs may be reduced to 1 nm, which enhances the direct tunneling of currents from the channel to the traps in the oxide. Therefore, quantum effects such as RTN may be more pronounced in sub-20 nm nodes where the gate insulator thickness is reduced.

2.2.1.4 Temperature effect inversion and self-heating in FinFETS: The delay of planar transistors increases with temperature due to a decrease in the drive current capability of the device. FinFETs exhibit a reverse trend in delay with temperature. In FinFET based circuits, the decrease in gate delay with temperature is described as temperature effect inversion (TEI) as the drive current of the FinFET strengthens with increasing temperature. The increase in the drive current is due to the tensile stress effect from the insulator layer to the body of the vertical fin, which affects the carrier mobility. The phenomenon may be more pronounced in technology nodes below 22 nm. SPICE simulation of an inverter chain may be performed on a 7 nm predictive technology model (PTM) of a FinFET process to determine the variation in the F04 delay with temperature and power supply voltage, with results shown in FIG. 2.3. The delays may be normalized to a nominal voltage of 0.7 V. Similar to FinFET devices in 10 to 20 nm processes, the 7 nm PTM transistors also exhibit TEI with greater variation in delay at sub/near threshold voltages.

The vertical fins are embedded in an oxide layer with a very narrow connection between the fins and silicon body. Due to the high current densities in ICs fabricated using sub-20 nm FinFET based transistors, the operating temperature on the fins rises due to the poor heat dissipation to the silicon bulk. The localized temperature of central fins in a multi-fin transistor may be higher due to an increase in the distance from metal contacts. The localized heating due to high current densities and poor heat dissipation of FinFETs is described as the self-heating effect (SHE). Degradation in reliability due to aging (BTI, HCl, and TDDB) may be accelerated by SHE. The models for BTI, HCl, and TDDB increase in complexity when accounting for SHE, as SHE is a localized phenomenon impacting individual FinFETs rather than circuit blocks. Therefore, it is a challenge to mitigate the effects of SHE with conventional techniques to reduce hotspots. In addition, the SHE of FinFETs may exacerbate the effect of electromigration on the metal interconnects surrounding the device. Both power rails and signal interconnects are affected due to self-heating. Prior work has also shown significant reduction in the lattice temperature with power supply voltage scaling. Therefore, as indicated by FIG. 4, power supply voltage scaling provides a significant reduction in the SHE of nanoscale FinFETs. However, existing on-chip sensor based adaptive voltage techniques or thermal management techniques do not account for the complex interaction of SHE with BTI, HCl, and TDDB as well as the inverse relationship of the FinFET delay with the operating temperature (TEI).

2.2.2 Electromigration

Scaled transistor technologies have also exacerbated the probability of electromigration (EM) in interconnects used for signaling and the power distribution network. The fundamental causes include increased current density, a tight-pitch between interconnected metal layers, self-heating in 3-D multi-gate transistors, and increasing interconnect resistance. In addition to the reduction in the interconnect cross-sectional area, carrier scattering from the boundaries of individual metal crystal grains is contributing to an increase in the interconnect resistivity. EM is difficult to predict and prevent through chip or wafer testing as a correlation exists between various parameters including manufacturing defects, workload, and environmental conditions.

2.2.3 Combined Effect of PVT, Aging, SHE, TEI, and Noise

The physical phenomenon related to trapped charge carriers at various interfaces of the MOS/FinFET lead to a degradation of the Vth and, therefore, a reduction in the characteristic operating frequency of the transistor with time. The scaling of the transistor may result in an increased sensitivity to charge trapping and de-trapping. The failure probability of the interconnect due to EM also increases. The experimental and physical models of BTI, TDD, HCI, and EM indicate a direct relationship with the operating voltage of the transistor. This direct relationship offers an opportunity to apply adaptive voltage scaling (AVS) during the lifetime of the circuit to reduce the rate of degradation in circuit parameters due to aging.

The disparate effects of PVT variation, aging, SHE, TEI, and noise that impact the power integrity of high-performance integrated circuits fabricated in sub-20 nm FinFET nodes have thus far been addressed individually while developing power or thermal management solutions. Design time modeling of process variation, EM, BTI, HCl, TDDB, RTN, TEI, SHE, and IR drop on the PDN may be insufficient to predict the combined effect on the load circuits, the on-chip sensors that monitor the circuit properties, and the on-chip power distribution network including the distributed voltage regulators. The on-chip components affected by the various phenomena are shown in FIG. 2.5. The package and the global power distribution network are not shown in FIG. 5, but are also impacted by EM, power supply noise, and transient faults. The combined effect of aging induced variation on the OCVRs (different topologies age at different rates when subject to the same load, temperature, and environmental conditions) and the load circuit is unknown. As shown in FIG. 2.2(b), the PMOS header in the low drop out regulator experiences a reduction in the drive current IP MOS with temperature, circuit activity, and time, due to an increase in the threshold voltage. The degradation in the drive current of a buck converter with age differs from an LDO due to the complex function of the MOS power switch, MOS drivers, and the pulse width modulation circuit. In addition, such model based aging analysis ignores the passive components and the interconnects in the OCVR that suffer from increased EM as a function of the duration of the applied stress.

The combined effect of aging and temperature on the interconnects and sub-20 nm FinFETs has not been modeled in literature. The parasitic resistance and capacitance of the interconnects increase with temperature; however, the current drive of the FinFET transistors improves due to TEI, which reduces the delay of the path. Alternatively, given disparate stress times for the load circuits and the spatial temperature variation across the die, the rate of aging in the load circuit and the OCVRs is not identical. In a circuit with distributed OCVRs, assigning the same reference voltage Vref to all the OCVRs is not the best practice as process variation and an aging induced shift in Vth affects the load circuits and the OCVRs non-uniformly, even in the same voltage domain. Due to the complexity of implementing disparate Vref circuits for a large number of distributed OCVRs, a tradeoff between the accuracy of the assigned local voltages and the circuit cost (area and power) of the implementation is required.

Due to the limitations of accurately modeling or predicting the impact of the different phenomenon that degrade the power and signal integrity of a deeply scaled system, the use of voltage guard-bands appears to provide the most effective solution for advanced technology nodes. However, given the highly scaled operating voltages and diminishing difference between super threshold and near threshold operation, adding guard-bands to the operating voltage negates the benefits of technology scaling with regard to reducing the power consumption of the circuit Timing guard-bands that are added to the critical path(s) of the circuit are, therefore, a more conservative solution while resulting in a reduction in the performance benefits of sub-20 nm FinFET technology. By definition, a critical path in a synchronous clocked digital system is the path with the largest signal propagation delay.

The maximum clock frequency is set by the critical path delay. Conventionally, critical paths may be identified during the statistical static timing analysis (SSTA) of the sequential circuit. However, in advanced technology nodes, there are multiple challenges to correctly identify all the critical paths in a circuit. The critical path is dependent on the executing workload, which is a run-time variable unknown during SSTA. Process variation and aging effects, which include both spatial and temporal variation, influence the delay of the paths. Therefore, new critical paths emerge with time. Due to the complex interaction of the workloads, process variation, ambient conditions, and circuit aging, critical path identification is no longer deterministic at design time. Therefore, a run-time technique is needed to identify evolving critical paths in the circuit and auto-adjust the operating voltage and clock frequency to mitigate timing failures on the critical paths.

2.3 Learning Algorithm for an Evolvable Pdn

Algorithms that optimize the control of the distributed on-chip voltage domains exist and classical optimization methods including linear programming, non-linear programming, Newton's method, quadratic programming, and sequential unconstrained minimization assume that the variable being optimized is continuous, which yields local optimum solutions. The on-chip power delivery system with OCVRs contains both discrete and continuous control variables. Applying techniques for continuous variables to discrete variables results in both an increase of the objective function and in violations of inequality constraints. Evolutionary programming methods including simulated annealing, genetic algorithm (GA), tabu search, and particle swarm optimization may be better suited for discrete variables and non-differential objective functions. Genetic algorithms are based on Darwinian theories of evolution and use processes analogous to genetic recombination and mutation to promote the evolution of a population that best satisfies a predefined objective. The selective crossover process involves choosing fit individuals to produce additional offspring, which improves the average result as the algorithm progresses. Subsequent mutations of the offsprings add diversity to the population and explore new areas of the search space of the parameter. Genetic algorithms have been extensively used in circuit design, particularly for high speed clock distribution and post-silicon tuning of the clock delay. A GA based method to determine the workloads that consume the peak power in a core has been implemented by ARM for the Cortex series of processors. The primary disadvantage of applying a GA for run-time applications is an increase in the latency to optimize the circuit and architecture parameters as the search space increases. The increased latency and the globally sub-optimal results across the search space are limitations for other evolutionary techniques including simulated annealing and ant-colony optimization.

The particle swarm optimizer (PSO), however, offers a robust and simple implementation that produces superior results as compared to other evolutionary algorithms. The PSO offers different routes through the problem hyperspace as compared to the GA and other optimization algorithms. The low overhead to store results during each iteration of the algorithm and the simplicity of the circuit implementation make the PSO algorithm an ideal choice for run-time control of the power supply voltages.

2.3.1 A. Voltage Guard-Band Modulation Based on Particle Swarm Optimization

The particle swarm optimizer operates on a set of particles p1, p2, . . . ,pn, where the position of each particle xi in a D dimensional hyperspace represents a potential solution to the optimization problem. For a given particle pi, the position and velocity at time t are represented as, respectively, $x_i(t)=(x_{i,1}(t), X_{i,d}(t), \ldots, x_{i,D}(t))$ and $v_{i,d}(t)=(v_{i,D}(t), v_{i,d}(t), \ldots, v_{i,D}(t))$. The current best position for particle $p_i$ is recorded as $P_{best}=(P_{i,1}(t), P_{i,D}(t), \ldots, P_{i,D}(t))$. The best position among the entire particle population is recorded as $G_{best}$. The velocity and position of a particle constantly change based on both the experiences of the particle and the experiences of the other particles in the swarm. The position and velocity of the particles are updated as given by equations 2.2 and 2.3, respectively. In equations 2.2, w is the inertia weight, $\varphi_1$ and $\varphi_2$ are the learning factors, and $\rho_1$ and $\rho_2$ are random functions in the range of [0,1].

The inertia weight w is applied to constrain the influence of past velocities on the current velocity of a particle. A large w enables a wider exploration of the hyperspace, whereas a small w results in a more local exploration to fine tune the current search results. A linear decrease in w with time (decreasing w strategy) yields near optimal results with the least iterations. The cognitive parameter $\varphi_1$ provides a weight to the prior velocity of a particle when determining the current velocity. The social parameter cpz provides a weight to the swarm when determining the new velocity of a particle. The values w, $\varphi_1$, and $\varphi_2$, therefore, set a procedure for the exploration of the hyperspace D.

$$v_{I,D}(t+1)=\omega \times v_{I,D}(t)+\phi_1 \times \rho_1 \times (P_{I,D}(t)-x_{I,D}(t))+\phi_2 \times \rho_2 \times (G_{I,D}(t)-x_{I,D}(t)) \qquad (Eq\ 2.2)$$

$$x_{i,d}(t+1)=x_{i,d}(t)+v_{i,d}(t+1) \qquad (EQ.\ 2.3)$$

2.3.2 Problem Formulation with PSO

The current method to assign a supply voltage to a power domain consisting of various functional units may be based on the addition of static voltage guard-bands. The appropriate guardband may be determined by assuming a pessimistic worst-case analysis of the noise margins, which may lead to the sub-optimal energy efficiency of the system. An implementation of the proposed methodology that applies the PSO to dynamically adjust the voltage guard-band at run-time is shown in FIG. 2.6. An SMT processor 2610 is shown with distributed on-chip voltage regulators 2620 supplying current to the various functional units. Distributed timing sensors 2630 measure the timing margin at the operating frequency of the circuit and transmit the data to the power management unit controlling the voltage reference of the OCVRs 2640. The reference voltage of each OCVR is independently modulated based on the optimized values provided by the on-line PSO algorithm. Alternatively, to reduce the complexity of implementing the circuit that generates the reference voltage for each OCVR 2640, the PSO provides a global optimum voltage applied as a common reference to all OCVRs 2640.

The optimization of the voltage guard-band for a given voltage domain with distributed on-chip voltage regulators is formulated as described by Equations 2.4-2.7. The objective function is to maximize the energy efficiency of each voltage domain as given by 2.4:

$$\text{maximize } \eta_{energy}=f(\delta_1,\delta_2) \qquad (EQ\ 2.4)$$

$$\text{s.t. } VID_{min} \leq \delta_1 \leq VID_{max} \qquad (EQ\ 2.5)$$

$$V_{min} \leq \delta_2 \leq V_{max} \qquad (EQ\ 2.6)$$

$$T_{margin}=g(\delta_2) \geq 0 \qquad (EQ\ 2.7)$$

The energy efficiency $\eta_{energy}$ is a function of the control variable Si and the dependent variable 82. The control variable $\delta_1$ represents the discrete reference voltage $V_{ref\_i}$ assignment to the OCVR pi, while the dependent variable $\delta_2$ represents the continuous output voltage of the OCVR. In a two-tiered configuration of the on-chip power delivery network, the input voltage to the OCVRs is provided as a dependent variable to the optimization problem. The constraint given by equations 2.5 restricts the range of the reference voltage assignments to the programmable voltage identification (VID) levels of the power management circuit generating the voltage reference. The constraint given by equation 2.6 restricts the output voltage of the OCVRs in a given domain to the limit in the operating voltage of the MOS transistors set by the fabrication technology. The constraint given by equation 2.7 restricts the timing margin determined with the distributed timing sensors to a positive value. The timing margin of a critical path is inversely proportional to the set power supply voltage Sz of the OCVR.

2.3.3 Evolving Voltage Assignment

The distributed OCVRs operate as a swarm to locally optimize the operating voltage while applying the smallest needed guard-band to prevent timing violations on the local critical paths to compensate for aging related degradation in both the load and OCVR circuits. The optimization is completed through the computation of Pbest and Gbest, as given by, respectively, equations 2.8 and 2.9. The Pbest of a particle (OCVR) is a function of the sensed time delay from the nearest timing sensor. The Pbest values are the local optimal voltages accounting for local phenomenon including IR drop, dI/dt noise, process and aging induced Vth degradation, and hotspots. The Gbest for the swarm of particles is the maximum Pbest value obtained across all OCVRs. The Pbest and Gbest are functions of time, providing the lowest power supply voltage to the circuit without resulting in timing violations.

$$P_{best_i}=f(Temp(t),V_{noise}(t),V_{th\_aging}(t),V_{load}(t)) \qquad (EQ\ 2.8)$$

$$G_{best}=\max(P_{best_i}) \qquad (EQ.\ 2.9)$$

The additional steps required to implement the PSO while designing a system with multiple processing cores are illustrated in FIG. 1.1. Existing statistical static timing analysis tools are applied to each voltage domain to determine the set of timing paths that exhibit high delay or are statistically likely to evolve as the paths with the maximum delay as the circuit ages. The set of likely timing paths are termed as potential critical paths (PCPs). A sensor may be integrated within each PCP to monitor violations of the timing margin. The placement of the distributed voltage regulators and time-based sensors is set with respect to the distribution of the PCPs.

The post-silicon procedure to execute the PSO is depicted in FIG. 1.2. At the first power up of the circuit, the distributed timing sensors are calibrated across the supported voltage and frequency ranges of the IC while executing a known workload that produces the lowest variation in the activity factor. The calibrated timing bins for each sensor at each frequency are stored on-chip RAM in a look up table (LUT). Due to intradie process variation, the calibrated bins vary for each timing sensor. The LUT is accessed by the on-line PSO, which compares the latest output from the timing sensor with the calibrated data in the LUT. As long as there is no violation in the timing margin (8$i$ in FIG. 2.7($a$)) of any of the PCPi and the captured timing bins are lower than the calibrated bins, the $P_{best}$ position is updated. In case of a timing margin violation in any of the PCPs, a recalibration of the time-based sensors may be performed. The inputs and outputs to the on-chip PSO block are shown in FIG. 2.7($a$). The algorithm for the evolving assignment of the power supply voltages, which include the routines CALIBRATE and PSO, is described by pseudo code provided in Algorithm 1.

The Pbest and Gbest values evolve with time as well as with changes in environmental conditions, operating temperature, and circuit aging. The procedure to assign an updated voltage (position) to each OCVR (particle) is shown in FIG. 1.2. The combined effect of aging and environmental conditions on the load circuits, voltage regulators, and the time-based sensors is compensated by the computed voltages of the PSO, which are applied to the distributed regulators. With no timing violations, the assigned voltage(s) mitigate the formation of thermal hotspots. As the system ages based on the executed workloads and environmental conditions, a number of recalibrations of the sensors are performed until there are no further possible modifications (reductions or increases) to the supply voltage at a given frequency.

2.3.4 Timing and Aging Sensor Data to Direct the PSO

On-chip sensors may be needed to inform and direct the decision of the on-chip PSO for the assignment of voltages to the swarm of OCVRs. An optimal selection of the sensors may be used to characterize the operating voltage, temperature, and frequency of each voltage domain. In addition, for the proposed PSO, aging sensors may be integrated to further characterize the state of the circuit as a means to prevent timing violations in potential critical paths. The construction and calibration of the timing and aging sensors is described as follows.

The post-silicon procedure to execute the PSO is depicted in FIG. 1.2. At the first power up of the circuit, the distributed timing sensors are calibrated across the supported voltage and frequency ranges of the IC while executing a known workload that produces the lowest variation in the activity factor. The calibrated timing bins for each sensor at each frequency are stored on-chip in a look up table (LUT). Due to intra-die process variation, the calibrated bins vary for each timing sensor. The LUT is accessed by the on-line PSO, which compares the latest output from the timing sensor with the calibrated data in the LUT. As long as there is no violation in the timing margin (8$i$ in FIG. 2.7($a$)) of any of the PCPi and the captured timing bins are lower than the calibrated bins, the Pbest position is updated. In case of a violation of the timing margin of any of the PCPs, a recalibration of the time based sensors is performed. The inputs and outputs to the onchip PSO block are shown in FIG. 2.7($a$). The algorithms for the evolving assignment of the power supply voltages, which includes the routines CALIBRATE and PSO, is described by pseudo code provided in Algorithm 1.

The Pbest and Gbest values evolve with time as well as with changes in environmental conditions, operating temperature, and circuit aging. The procedure to assign an updated voltage (position) to each OCVR (particle) is shown in FIG. 7($b$). The combined effect of aging and environmental conditions on the load circuits, voltage regulators, and the time based sensors is compensated by the computed voltages of the PSO, which are applied to the distributed regulators. With no timing violations, the assigned voltage(s) mitigate the formation of thermal hotspots. As the system ages based on the executed workloads and environmental conditions, a number of recalibrations of the sensors are performed until there are no further possible modifications (reductions or increases) to the supply voltage at a given frequency.

2.3.5 Timing and Aging Sensor Data to Direct the PSO

On-chip sensors may be used to inform and direct the decision of the on-chip PSO for the assignment of voltages to the swarm of OCVRs. An optimal selection and placement of the sensors may be used to characterize the operating voltage, temperature, and frequency of each voltage domain. In addition, for the proposed PSO, aging sensors may be integrated to further characterize the state of the circuit as a means to prevent timing violations due to aging in potential critical paths (PCPs). The construction and calibration of the timing and aging sensors may be described as follows.

Timing sensor: A timing sensor such as a latched-tapped delay line provides a way to quantify the variation in the captured clock edges propagating through a chain of buffers. The variation in the captured clock edges may be a function of the clock jitter, operating voltage, and temperature. Therefore, the combined effect may be characterized rather than individually quantifying the operating temperature, voltage, or load current with integrated physical sensors. Advanced circuit implementations of timing sensors may implemented in commercial microprocessors to characterize the available timing margin of critical paths (critical path monitors). The commercial sensors may be integrated with the run-time PSO.

A latched tapped delay line may be designed in a 7 nm FinFET PTM process and used as the timing sensor of the PCPs distributed across the IC to characterize and bin the location of the clock edge, with results provided to the on-line PSO. The schematic of the delay line based timing sensor is shown in FIG. 2.8($a$). The local clock signal for the given voltage domain in which the delay line is placed is applied to the buffer chain. The buffer (or bin number) at which the clock edge is captured provides a measure of the local physical and electrical characteristics of the circuit in the vicinity of the delay line. An illustration of capturing a clock edge is shown in F2.8(b) as the edge propagates through the delay line when an increase in the VDD occurs. The clock edges propagate through more inverters when the delay per bin (Delayperbin) decreases with an increase in supply voltage or temperature. An increase in Vth due to process variation and aging reduces the number of bins the clock edge propagates through.

The delay of a minimum sized inverter designed in a 7 nm FinFET PTM process at a nominal voltage of 0.7 V is 2.02 ps. Buffers may be implemented to reduce the size of the inverter chain and ensure that the fifth edge of the propagating clock at the highest supported operating frequency of 4 GHz is captured reliably across all PVT variation. The output of each buffer may be latched into master/slave flip-flops. The two consecutive latches that capture the opposite logical output of the buffers indicates the location of the propagating clock edge (rising or falling) in the buffer chain. The location of the fifth clock edge (bini[e5]) may be considered as the input to the PSO algorithm as the sensitivity to VDD increases the deeper the clock signal propagates into the buffer chain.

Aging sensor: A technique to predict circuit failure may be developed based on monitoring the transition of the output signal of a critical path and the detection of any transitions within the set timing interval of the guard-band. A signal transition detected in the guard-band interval implies that for the given input to the combinational logic, the critical path has slowed due to circuit aging and is close to generating a timing fault. A monitoring circuit is embedded into the output latch of a critical path. The block diagram of the monitoring circuit, consisting of the delay element and the stability checker, is shown in FIG. 2.9(a). The Output Latch stores the result of the stability checker. The schematic of the delay element and the stability checker is shown in FIG. 2.9(b). The delay element introduces a lag in the complement of the clock signal (Clock'), which is applied to the critical path. The delayed Clock' signal is provided as input to the stability checker, which checks for any change in the output of the critical path during the guard-band interval as shown in FIG. 2.9(c). The global Monitor signal activates the delay element, and therefore, the aging sensor. The sensor detects transistor aging without applying any error correction or recovery techniques. For the proposed on-chip PSO based voltage assignment methodology, an aging sensor is placed in each of the potential critical paths (PCPs) determined during the statistical static timing analysis of a voltage domain. The output 8$i$ for the stability checker, from each of the PCPi, is provided as an input to the PSO as shown in FIG. 1.1(a).

Calibration of the timing sensor: At the beginning of life of an IC, the distributed latched tapped delay lines are calibrated and the results are stored in a LUT. The calibration is performed at a nominal temperature of 25C. A workload is executed on the processing elements of the voltage domain being calibrated that generates the least variation in the voltage of the power supply for a constant activity factor. The location of the timing sensors provides a characterization of the process variation in a given voltage domain as the delay per bin amongst the timing sensors varies with differences in Vth. The variation in delay for a normal distribution (a/p of 0.9%) of Vth is shown in FIG. 2.11(c) for a 7 nm FinFET PTM technology (distribution of Vth is shown in FIG. 2.11(d)). At each supported voltage level, the delay per bin (Delayperbin) for each timing sensor i is calculated as the difference between the edges of one clock cycle (bini[$e_5$]bini[$e_3$]), with the result stored in the LUT. The structure of the LUT with the corresponding stored results are listed in Table I, shown in FIG. 2.10. The bini[$e_5$]value corresponding to the nominal voltage, as specified by the foundry for the given technology node may be also stored in the LUT at the start of life for each timing sensor i as calib$_i$. The change in the bin$_i$[$e_5$]location with operating voltage at a nominal temperature of 25C and for a given Vth of 0.34 V is shown in FIG. 2.11(a). Due to TEI, the variation in the bin$_i$[$e_5$]position with operating temperature for a supply voltage of 0.7 V and a Vth of 0.34 V is shown in FIG. 2.11(b). In both cases the bin$_i$[$e_5$]location is given by the inverter at which the fifth clock edge is detected. The sensitivity of the latched tapped delay line to process, aging, voltage, and temperature, therefore, works well as an on-chip sensor to direct the PSO algorithm During the operational lifetime of the IC, subsequent calibrations may be performed if a violation in the timing margin is detected by the aging sensor. The calibration carried out during the lifetime of the IC is provided by the CALIBRATE procedure of the PSO as described in Algorithm 1, FIG. 1.5. The Delayperbin value D1 corresponding to the current best voltage assignment Pbest1 of an OCVR is compared with the updated calibration data obtained at each supported operating voltage. The updated voltage Pbest2 corresponding to D1 is assigned as the new reference voltage to the OCVR. For reference, see FIG. 2.12.

2.4 Simulated Results of Pso Voltage Assignment

The feasibility of run-time voltage assignment through the PSO was analyzed for SMs in a GPU and cores in a chip multiprocessor (CMP). The run time PSO is, however, applicable to any circuit with on-chip distributed voltage regulators. The PSO algorithm, as given by Algorithm 1, was implemented in MATLAB and in Verilog. The MATLAB model is used to characterize variations in the load current profile, power supply voltage, and threshold voltage. The verilog model is used in SPICE simulations along with Verilog-A models of the LDOs, timing sensors, aging sensors, and the on-chip power distribution network.

2.4.1 Simulation Setup

A streaming multiprocessor (SM) of an NVIDIA GV100 GPU was emulated with a constructed floor plan as shown in FIG. 2.13(a). Each SM in the GV100 was partitioned into four processing blocks, with each block containing 16 FP32 cores, 8 FP64 cores, 16 INT32 cores, a 64 KB register file, an LO Icache, and two tensor cores. Three on-chip LDOs are considered per partition, which were roughly positioned within the FP64/INT32 cores, the register file, and the tensor cores. All four partitions of the SM are considered to operate as a single voltage domain with 12 LDOs. The SM and the LDOs were designed in a 7 nm FinFET PTM process. The power traces for the functional blocks of the SM and the SM floor plan were used as inputs to Voltspot 2.0, which is a cycle accurate simulator. The voltage map across the power grid at discrete locations of the SM is obtained from Voltspot 2.0. The variation in Vth for the SM was determined using VARIUS, assuming a 0.9% a/p ratio and a spatial correlation parameter cp of 0.2. The voltage and the Vth maps were provided as inputs to the PSO model developed in MATLAB. The $G_{best}$ obtained by the PSO per clock cycle is used to generate an updated power trace with the same activity factor as the original power trace inputted to Voltspot. The updated power trace was then applied as an input to the Hotspot simulator to characterize the temperature across the SM. The simulation framework of the MATLAB based PSO is depicted in FIG. 2.13(b).

A four-core chip multi-processor (CMP) which includes a verilog model of the PSO, is simulated in SPICE. The architectural parameters of the CMP are listed in Table II, FIG. 2.15. A set of 20 applications from the SPEC CPU2006 benchmark suite was used to determine the per cycle power dissipation of the core in a 7 nm FinFET PTM process. The power traces were used as piece wise linear waveforms to drive the current loads in the SPICE simulation. The current loads are connected to a circuit model of the (PDN), with each branch of the PDN designed as a series connection of a resistor and inductor. A total of 5 µF of distributed on-chip capacitance was implemented. The 16 Verilog-A models of the LDO were distributed across the PDN such that there are four LDOs per core. A Verilog model of the latched tapped delay line was developed that accounts for the variation in delay with temperature, VDD, and Vth, as shown in FIGS. 2.11(*a*), 2.11(*b*), and2.11(*c*). A total of 16 delay lines were distributed in close proximity to the LDO models. The model of the circuit used for SPICE simulation is shown in FIG. 2.14.

2.4.2 Voltage Assignment by the PSO Algorithm

Simulations were conducted to characterize the execution of the PSO algorithm on a circuit with spatial and temporal variation in the power supply voltage and threshold voltage. Results from simulation of a voltage domain with 16 OCVRs are shown in FIG. 2.16(*a*)-(*c*). The voltage domain includes 7 nm transistors that operate at a nominal voltage vnom of 0.7 V. The nominal Delayperbin, simulated at VDD=vnom and T=25C is 2.02 ps. A 20 ps timing margin was provided when implementing an aging sensor to monitor the timing of a critical path, where the initial delay of the paths at start of life is 200 ps. A σ/μ ratio of 0.9% was considered across the voltage domain to characterize process related variation. The clock frequency was set to 4 GHz.

A uniform random power supply noise of 10% of VDD was applied for a temperature is set to 25° C. The variation in the Pbest values computed by the PSO for the 16 OCVRs for a time of execution of 1 μs is shown in FIG. 2.16(*a*). The evolving Gbest value computed by the PSO for the given voltage domain is shown in FIG. 2.16(*b*). Even with voltage noise 5% greater than vnom, the PSO converges to a Gbest value significantly lower than vnom without any timing violations in the critical path(s). The percentage reduction in the combined dynamic and static power consumption when applying the adaptive global Gbest voltage assigned to a domain as compared to an assignment of vnom is shown in FIG. 2.16(*c*).

2.4.3 Power Supply Noise Compensation

Prior research characterizing the power profile of a SM determined that the caches are subject to the least amount of variation in power consumption. The FP and INT cores along with the register file (RF) are subject to large variations in power per cycle. The power variation characteristics of the NVIDIA tensor core are not publicly disclosed. However, if assuming a constant execution of matrix multiplication and addition operations by the tensor cores, the power consumption is assumed to be less variable as compared to the FP and INT cores.

Multi cycle power traces are generated for the FP/INT cores, the RF, and the tensor cores such that the induced voltage noise is, respectively, 10%, 5%, and 2% of the 0.7 V nominal VDD. The OCVR supplying the RF also powers the LO cache, warp scheduler, and the dispatch unit. Therefore, the combined variation in the activity of the partition is set to 5%. The activity pattern (temporal) and the placement of the circuit blocks (spatial) have a combined effect on the timing and magnitude of the power supply noise at any given location on the PDN. The parameters of the on-line PSO are characterized to determine the effect on the exploration of the voltage search space with respect to the varying activity factors of the functional blocks of the SM. The personal acceleration coefficient (c1) weighs the PSO decision more towards local noise events in the vicinity of the timing sensors, which are placed in close proximity to the OCVRs in the SPICE simulation. The reverse occurs for the social acceleration coefficient (c2). The optimum voltage assignment is obtained when the personal and social acceleration coefficients are equal, which results in no timing violations. The voltage assignment becomes more conservative (less variance between Pbest values) as the c2 coefficient is increased for a given c1. The results when setting both the personal (c) and social (c) coefficients equal to each other are shown in FIG. 2.17(*a*), whereas the results for the assignment of Pbest when the PSO relies completely on the swarm (or social behavior) are shown in FIG. 2.17(*b*). The reduction in the variance of Pbest when applying the voltage determined by the swarm optimization algorithm implies that blocks experiencing greater noise (overshoot due to LdI/dt) are assigned a lower voltage due to the influence of blocks with low to zero variation in activity. The reverse is true for the voltage assignment of blocks with low variation in activity, which provides less opportunity to reduce the voltage margin of such functional blocks.

In addition, if the operating system level workload scheduler provides data to the PSO from the architecture level activity counters, the inertial coefficient w is tuned based on the workload activity of the various functional blocks. A low value is assigned to w when more than one functional block exhibits high variation in activity factor, which ensures that the past voltage assignment of the PSO does not dominate the current assignment and the PSO searches for a solution that satisfies the transient power supply noise of the circuit.

2.4.4 Reduction in Transistor Aging

The aging induced degradation in Vth for an SM modeled as an NVIDIA GV100 was analyzed. An off-chip voltage regulator supplying current to the entire SM was considered as the baseline topology and is compared with the proposed technique implementing a PSO based run-time voltage assignment of twelve distributed OCVRs, with placements as shown in FIG. 2.13(*a*). The selected aging model was validated through wafer measurements on a sub-20 nm FinFET-based ring oscillators. The process and aging induced shift in the threshold voltage ΔVth(t) is mathematically expressed as given by Equation 2.10. The $\Delta_{Vth}(t)$ has a normal distribution with a mean $\Delta_{VthA}(t)$, which is the average shift in the threshold voltage attributed to BTI and is expressed by the power law given by equation 2.11. The technology and fitting parameters, A, κ, α, β, and γ in equation 2.11 are taken from prior work and are listed in Table III, FIG. 2.18. The environmental and physical parameters required to calculate equation 2.11 include the temperature in Kelvin (K)θ, the total stress time in seconds t, the duty factor of the stress signal df, and the electric field across the gate oxide in V/m $E_{ox}$. The variance in the threshold voltage $\sigma^2_{\Delta Vth}$ (t) due to process variation and aging is given by equation 2.12, where $\sigma2_{\Delta Vth0}$ is the variance due to process variation at the beginning of life of the SM. The SM is assumed to consist of an equal number of PMOS and NMOS transistors. The process induced variation in Vth is identical for the baseline and the PSO based SM.

$$\Delta V_{th}(t) = \mathcal{N}(\langle \Delta V_{thA}(t) \rangle, \sigma_{\Delta V_{th}}(t)) \quad \text{(EQ. 2.10)}$$

$$\langle \Delta V_{thA}(t) \rangle \cong A e^{-\kappa/\theta} t^\alpha E_{OX}^\gamma df^\beta \quad \text{(EQ. 2.11)}$$

$$\sigma^2_{\Delta V_{th}}(t) = \left(1 + \frac{\langle \Delta V_{thA}(t) \rangle}{0.1\,V}\right) \sigma^2_{\Delta V_{th0}} \quad \text{(EQ. 2.12)}$$

The distributed OCVRs were implemented as LDOs. The aging of the PMOS header of the LDO was considered when determining the effect on the Vth due to the aging of the SM. As the output voltage from the LDOs is modulated by the PSO, variation occur in both the electric field across the gate oxide (Eox) of the load circuits, which includes the distributed timing sensors, and the operating temperature. The updated temperatures across the SM were determined using Hotspot. The rate of aging for the baseline SM and the SM with PSO voltage assignment is calculated using the model given by equation 2.11 and equation 2.12 for the same stress time t and duty factor df. The variation in the Vth of an SM designed in a 7 nm FinFET process at the start of life and at the end of life (EOL) of 10 years for both the baseline SM and the SM with adaptive voltage assignment by the PSO are shown in FIGS. 2.19(*a*) to and 2.19(*b*). The analysis considered the Gbest for the 12 OCVRs of a SM. Despite accounting for large power supply noise (10% on the FP/INT cores), the cumulative effect with time of the adaptive power supply voltage significantly reduced the rate of transistor aging, with a mean reduction in $\Delta V_{thA}(t)$ of 40%. The improvement is due to the reduction in the applied electric field across the oxide $E_{ox}$ of the transistors as compared to the base line. The reduced temperature due to a lower applied voltage marginally improves the aging characteristics of the circuit. The reduced degradation in Vth due to aging is shown for both high-Vth and low-Vth 7 nm FinFET devices in FIGS. 2.19(*a*) and 2.19(*b*), 2.4.5 Reduction in Operating Temperature The thermal simulator HotSpot 6.0 was used to characterize the effect of the evolving voltage assignment by the PSO on the temperature profile of the SM. Similar to Voltspot, the inputs to Hotspot are the SM architectural floorplan and the power trace. The floorplan of one GPU processing cluster (GPC) with 14 SMs was considered for the temperature analysis. A series of differential equations were iteratively solved by Hotspot to compute the temperatures of the functional block. The average temperature of the area of the functional units was reported as an output. The transient temperatures for the RF, INT/FP cores, and tensor cores were determined through Hotspot by providing an updated power trace file computed using the $G_{best}$ per clock cycle obtained by the PSO for 0.5 million clock cycles. Equal values of the personal (c1) and social (c2) acceleration coefficients are chosen for the analysis. The minimum, maximum, and mean reductions in temperature for each block in the floorplan as compared to the baseline are listed in Table IV, FIG. 2.20.

An average reduction of 5C is observed across the RF, INT/FP cores, and tensor cores when a global best voltage assignment is applied to the circuit that is at least 20% less than the 0.7 V nominal voltage recommended for the 7 nm FinFET technology node. The self-heating of the FinFETs was not captured through architectural level simulators including Hotspot. As the self-heating of the transistor and the local interconnects is directly proportional to the applied gate voltage, a reduction in the temperature due to self-heating is expected when implementing the PSO based voltage assignment.

2.4.6 Hardware Overhead of Run-Time PSO Implementation

The overhead in area and compute cycles of implementing the on-line PSO for adaptive voltage assignment is estimated for the circuit shown in FIG. 2.14, with the costs summarized in Table V, FIG. 2.21. The circuit and computational overheads to implement and execute the PSO were determined for a voltage domain with 16 distributed OCVRs supporting six distinct reference voltage levels, 16 delay line based timing sensors, and 12 PCPs. The computation time to determine a new Pbest and Gbest value for each OCVR is twenty clock cycles. The required size of the LUT increased with the operating age of the IC. As a means to reduce the size of the LUT, the allocated memory was reused after every two years of storing the calibration data. The fastest degradation in the threshold voltage of the OCVR and load circuit occurred in the first two years of the operating life of the IC. Beyond the first two years, the operating temperature became a more critical parameter than the total stress time of the load circuit. Through the adaptive voltage assignment of the PSO, the reductions in voltage from the design time nominal value occur less frequently near the end of life of the IC. Therefore, the calibration results during the start of life of the IC do not need to be retained in the LUT.

The objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense. While the invention has been described with reference to the embodiments above, a person of ordinary skill in the art would understand that various changes or modifications may be made thereto without departing from the scope of the claims.

What is claimed is:

1. A method for determining the minimum operating voltage of an integrated circuit with multiple processor cores, comprising
running a particle swarm optimization (PSO) algorithm on a circuit, wherein the PSO algorithm includes the steps of applying statistical static timing analysis to a voltage domain to determine a set of timing paths that exhibit high delay or are statistically likely to evolve as the paths with a maximum delay as the circuit ages; and
providing distributed on-chip DC-DC voltage converters or voltage regulators: distributed time-based sensors; and providing a look up table stored in on-chip memory, wherein time-based sensors are monitored at the beginning of life of the multiple processor cores and calibrated as voltage meters, and wherein the time-based sensors are calibrated as timing meters, temperature meters, current meters, or other metering type that correlates to the operating voltage in a domain.

2. The method of claim 1, wherein the set of timing paths are potential critical paths (PCPs) that comprise digital and analog circuit blocks.

3. The method of claim 2, wherein timing guardband violation sense circuits are included in the PCPs.

4. The method of claim 1, wherein the time-based sensor calibration is performed at each supported clock frequency of the processing cores and each supported on-chip voltage level constrained by a given fabrication technology.

5. The method of claim 4, wherein the calibrated digital values of timing, clock frequency, and voltage are stored in a look up table (LUT) in on-chip memory, wherein the calibrated digital values of each time based sensor within a given voltage domain and a given clock frequency differ due to process variation.

6. The method of claim 5, wherein an inferred voltage from each time-based sensor is a particle in the PSO.

7. The method of claim 6, wherein updated velocities for each particle in the PSO are obtained through circuit implementation of the PSO, wherein updated particle positions are computed from the particle velocities.

8. The method of claim 7, wherein tunable weights are assigned for the computation of each particle velocity such that emphasis to local voltage variations is tuned to mitigate power supply noise and thermal hotspots.

9. The method of claim 8, wherein a personal best position for each particle is updated to be the current particle position when the captured timing edge is lower than the calibrated value stored in the LUT and no timing violation is detected in the PCPs.

10. The method of claim 1, wherein the calibration of the time-based sensors is performed again if a flag is raised in timing guardband violation sense circuits in the PCPs.

11. The method of claim 10, wherein a global best position for an entire particle population is updated as a maximum value of a personal best of all particles.

12. The method of claim 11, wherein the global best position is a new assigned voltage to the voltage domain.

13. The method of claim 11, wherein a personal best position of each particle is a new reference voltage of a nearest voltage regulator in a system that supports an independent reference voltage generation circuit.

14. The method of claim 13, wherein the updated voltage is assigned continuously to the processing cores such that performance degradation due to circuit aging, local hotspots, and power supply noise induced voltage variations are minimized without resulting in timing violations in the PCPs.

* * * * *